United States Patent
Koulakis et al.

(10) Patent No.: US 12,424,999 B2
(45) Date of Patent: Sep. 23, 2025

(54) TRANSVERSELY-EXCITED FILM BULK ACOUSTIC RESONATORS WITH GAP DIELECTRIC STRIPES IN BUSBAR-ELECTRODE GAPS

(71) Applicant: Murata Manufacturing Co., Ltd., Nagaokakyo (JP)

(72) Inventors: John Koulakis, Los Angeles, CA (US); William Lu, Santa Barbara, CA (US)

(73) Assignee: Murata Manufacturing Co., Ltd., Nagaokakyo (JP)

(*) Notice: Subject to any disclaimer, the term of this patent is extended or adjusted under 35 U.S.C. 154(b) by 66 days.

(21) Appl. No.: 18/187,376

(22) Filed: Mar. 21, 2023

(65) Prior Publication Data

US 2023/0223915 A1 Jul. 13, 2023

Related U.S. Application Data

(63) Continuation-in-part of application No. 18/065,830, filed on Dec. 14, 2022.

(60) Provisional application No. 63/322,119, filed on Mar. 21, 2022, provisional application No. 63/294,245, filed on Dec. 28, 2021.

(51) Int. Cl.
  *H03H 9/02* (2006.01)
  *H03H 9/00* (2006.01)

(52) U.S. Cl.
  CPC ...... *H03H 9/02228* (2013.01); *H03H 9/0014* (2013.01); *H03H 9/02015* (2013.01)

(58) Field of Classification Search
  CPC ............. H03H 9/02228; H03H 9/0014; H03H 9/02015; H03H 2003/021; H03H 2003/023; H03H 9/13; H03H 3/02
  See application file for complete search history.

(56) References Cited

U.S. PATENT DOCUMENTS

| 3,816,753 A | 6/1974 | Kino |
| 5,705,399 A | 1/1998 | Larue |
| 5,853,601 A | 12/1998 | Krishaswamy et al. |

(Continued)

FOREIGN PATENT DOCUMENTS

| CN | 1926763 A | 3/2007 |
| CN | 201893487 U | 7/2011 |

(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

(Continued)

*Primary Examiner* — Andrea Lindgren Baltzell
*Assistant Examiner* — Kimberly E Glenn
(74) *Attorney, Agent, or Firm* — ArentFox Schiff LLP

(57) ABSTRACT

An acoustic resonator device includes a substrate having a surface; an 82Y-cut lithium niobate piezoelectric plate attached to the surface of the substrate except for a portion of the piezoelectric plate forming a diaphragm that spans a cavity in an intermediate dielectric layer of the substrate; an interdigital transducer (IDT) at the piezoelectric plate such that interleaved fingers of the IDT are at the diaphragm; and a plurality of stripes of a dielectric material extending over ends of the interleaved fingers and portions of gaps between the ends of the interleaved fingers and opposing busbars of the IDT.

20 Claims, 17 Drawing Sheets

(56) References Cited

U.S. PATENT DOCUMENTS

| | | |
|---|---|---|
| 6,540,827 B1 | 4/2003 | Levy et al. |
| 6,707,229 B1 | 3/2004 | Martin |
| 7,135,940 B2 | 11/2006 | Kawakubo et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,802,466 B2 | 9/2010 | Whalen et al. |
| 7,868,519 B2 | 1/2011 | Umeda |
| 8,278,802 B1 | 10/2012 | Lee et al. |
| 8,344,815 B2 | 1/2013 | Yamanaka |
| 8,829,766 B2 | 9/2014 | Milyutin et al. |
| 8,932,686 B2 | 1/2015 | Hayakawa et al. |
| 9,130,145 B2 | 9/2015 | Martin et al. |
| 9,219,466 B2 | 12/2015 | Meltaus et al. |
| 9,276,557 B1 | 3/2016 | Nordquist et al. |
| 9,369,105 B1 | 6/2016 | Li |
| 9,425,765 B2 | 8/2016 | Rinaldi |
| 9,525,398 B1 | 12/2016 | Olsson |
| 9,748,923 B2 | 8/2017 | Kando et al. |
| 9,780,759 B2 | 10/2017 | Kimura et al. |
| 10,200,013 B2 | 2/2019 | Bower et al. |
| 10,305,447 B2 | 5/2019 | Raihn et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,756,697 B2 | 8/2020 | Plesski et al. |
| 10,790,802 B2 | 9/2020 | Yantchev et al. |
| 10,797,675 B2 | 10/2020 | Plesski |
| 10,826,462 B2 | 11/2020 | Plesski et al. |
| 10,868,513 B2 | 12/2020 | Yantchev |
| 2002/0079986 A1 | 6/2002 | Ruby et al. |
| 2002/0158714 A1 | 10/2002 | Kaitila et al. |
| 2003/0199105 A1 | 10/2003 | Kub et al. |
| 2004/0041496 A1 | 3/2004 | Imai et al. |
| 2004/0090145 A1 | 5/2004 | Bauer et al. |
| 2004/0207033 A1 | 10/2004 | Koshido |
| 2004/0207485 A1 | 10/2004 | Kawachi et al. |
| 2004/0261250 A1 | 12/2004 | Kadota et al. |
| 2005/0280476 A1 | 12/2005 | Abe et al. |
| 2006/0072875 A1 | 4/2006 | Bhagavatula et al. |
| 2006/0125489 A1 | 6/2006 | Feucht et al. |
| 2006/0131731 A1 | 6/2006 | Sato |
| 2006/0152107 A1 | 7/2006 | Tanaka |
| 2006/0222568 A1 | 10/2006 | Wang et al. |
| 2007/0001549 A1 | 1/2007 | Kando et al. |
| 2007/0090898 A1 | 4/2007 | Kando |
| 2007/0170565 A1 | 7/2007 | Hong et al. |
| 2007/0188047 A1 | 8/2007 | Tanaka |
| 2007/0194863 A1 | 8/2007 | Shibata et al. |
| 2010/0064492 A1 | 3/2010 | Tanaka |
| 2010/0102669 A1 | 4/2010 | Yamanaka |
| 2010/0107388 A1 | 5/2010 | Iwamoto |
| 2010/0123367 A1 | 5/2010 | Tai et al. |
| 2010/0212127 A1 | 8/2010 | Heinze et al. |
| 2010/0223999 A1 | 9/2010 | Onoe |
| 2010/0301703 A1 | 12/2010 | Chen et al. |
| 2011/0109196 A1 | 5/2011 | Goto |
| 2011/0199163 A1 | 8/2011 | Yamanaka |
| 2011/0278993 A1 | 11/2011 | Iwamoto |
| 2013/0015353 A1 | 1/2013 | Tai et al. |
| 2013/0021116 A1 | 1/2013 | Sogoya et al. |
| 2013/0057360 A1 | 3/2013 | Meltaus et al. |
| 2013/0234805 A1 | 9/2013 | Takahashi |
| 2013/0321100 A1 | 12/2013 | Wang |
| 2014/0001919 A1 | 1/2014 | Komatsu |
| 2014/0009032 A1 | 1/2014 | Takahashi et al. |
| 2014/0113571 A1 | 4/2014 | Fujiwara |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0218129 A1 | 8/2014 | Fujiwara |
| 2014/0225684 A1 | 8/2014 | Kando et al. |
| 2014/0312994 A1 | 10/2014 | Meltaus et al. |
| 2015/0070227 A1 | 3/2015 | Kishino et al. |
| 2015/0319537 A1 | 11/2015 | Perois et al. |
| 2015/0333730 A1 | 11/2015 | Meltaus |
| 2016/0028367 A1 | 1/2016 | Shealy |
| 2016/0049920 A1 | 2/2016 | Kishino |
| 2016/0182009 A1 | 6/2016 | Bhattacharjee |
| 2016/0285430 A1 | 9/2016 | Kikuchi et al. |
| 2017/0005638 A1 | 1/2017 | Otagawa et al. |
| 2017/0063332 A1 | 3/2017 | Gilbert et al. |
| 2017/0077902 A1 | 3/2017 | Daimon |
| 2017/0104470 A1 | 4/2017 | Koelle et al. |
| 2017/0170808 A1 | 6/2017 | Iwaki et al. |
| 2017/0179928 A1 | 6/2017 | Raihn et al. |
| 2017/0187352 A1 | 6/2017 | Omura |
| 2017/0214387 A1 | 7/2017 | Burak et al. |
| 2017/0222618 A1 | 8/2017 | Inoue et al. |
| 2017/0222622 A1 | 8/2017 | Solal et al. |
| 2017/0264263 A1 | 9/2017 | Huang et al. |
| 2017/0324394 A1 | 11/2017 | Ebner et al. |
| 2017/0359050 A1 | 12/2017 | Irieda et al. |
| 2017/0370791 A1 | 12/2017 | Nakamura et al. |
| 2018/0062604 A1 | 3/2018 | Koskela et al. |
| 2018/0123016 A1 | 5/2018 | Gong et al. |
| 2018/0152169 A1 | 5/2018 | Goto et al. |
| 2018/0191322 A1 | 7/2018 | Chang et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0148621 A1 | 5/2019 | Feldman et al. |
| 2019/0181833 A1 | 6/2019 | Nosaka |
| 2019/0245518 A1 | 8/2019 | Ito |
| 2019/0273480 A1 | 9/2019 | Lin |
| 2019/0273481 A1 | 9/2019 | Michigami |
| 2019/0386635 A1 | 12/2019 | Plesski et al. |
| 2019/0386637 A1 | 12/2019 | Plesski et al. |
| 2019/0386638 A1 | 12/2019 | Kimura et al. |
| 2020/0007110 A1 | 1/2020 | Konaka et al. |
| 2020/0021271 A1 | 1/2020 | Plesski et al. |
| 2020/0091893 A1 | 3/2020 | Plesski et al. |
| 2020/0162052 A1 | 5/2020 | Matsuoka et al. |
| 2020/0220522 A1 | 7/2020 | Nosaka |
| 2020/0228087 A1 | 7/2020 | Michigami et al. |
| 2020/0304091 A1 | 9/2020 | Yantchev |
| 2020/0328728 A1 | 10/2020 | Nakagawa et al. |
| 2020/0336130 A1 | 10/2020 | Turner |
| 2020/0373907 A1 | 11/2020 | Garcia |
| 2021/0006228 A1 | 1/2021 | Garcia |
| 2021/0013859 A1 | 1/2021 | Turner et al. |
| 2021/0013868 A1 | 1/2021 | Plesski |
| 2021/0126619 A1 | 4/2021 | Wang et al. |
| 2021/0273631 A1 | 9/2021 | Jachowski et al. |
| 2021/0384885 A1 | 12/2021 | Daimon et al. |
| 2022/0103160 A1 | 3/2022 | Jachowski |
| 2022/0216842 A1 | 7/2022 | Nagatomo et al. |
| 2022/0231661 A1 | 7/2022 | McHugh |
| 2024/0154595 A1 | 5/2024 | Daimon |
| 2024/0154596 A1 | 5/2024 | Daimon |

FOREIGN PATENT DOCUMENTS

| | | |
|---|---|---|
| CN | 112352382 A | 2/2021 |
| DE | 112011100580 T5 | 1/2013 |
| JP | H0522074 A | 1/1993 |
| JP | H10209804 A | 8/1998 |
| JP | 2001244785 A | 9/2001 |
| JP | 2002300003 A | 10/2002 |
| JP | 2003078389 A | 3/2003 |
| JP | 2004096677 A | 3/2004 |
| JP | 2004129222 A | 4/2004 |
| JP | 2004304622 A | 10/2004 |
| JP | 2006173557 A | 6/2006 |
| JP | 2007251910 A | 9/2007 |
| JP | 2010103803 A | 5/2010 |
| JP | 2010109949 A | 5/2010 |
| JP | 2010233210 A | 10/2010 |
| JP | 2013528996 A | 7/2013 |
| JP | 2015054986 A | 3/2015 |
| JP | 2016001923 A | 1/2016 |
| JP | 2017220910 A | 12/2017 |
| JP | 2018166259 A | 10/2018 |

(56) References Cited

FOREIGN PATENT DOCUMENTS

| | | |
|---|---|---|
| JP | 2018207144 A | 12/2018 |
| JP | 2019186655 A | 10/2019 |
| JP | 2020088459 A | 6/2020 |
| JP | 2020113939 A | 7/2020 |
| WO | 2010047114 A1 | 4/2010 |
| WO | 2013021948 A1 | 2/2013 |
| WO | 2015098694 A1 | 7/2015 |
| WO | 2015156232 A1 | 10/2015 |
| WO | 2015182521 A1 | 12/2015 |
| WO | 2016017104 A1 | 2/2016 |
| WO | 2016052129 A1 | 4/2016 |
| WO | 2016147687 A1 | 9/2016 |
| WO | 2018003273 A1 | 1/2018 |
| WO | 2018079522 A1 | 5/2018 |
| WO | 2018163860 A1 | 9/2018 |
| WO | 2019138810 A1 | 7/2019 |
| WO | 2019241174 A1 | 12/2019 |
| WO | 2020092414 A2 | 5/2020 |
| WO | 2020175234 A1 | 9/2020 |
| WO | 2021060523 A1 | 4/2021 |
| WO | 2023002858 A1 | 1/2023 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.
M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Y. Yang, A. Gao et al. "5 GHZ Lithium Niobate MEMS Resonators With High Fom of 153", 2017 IEEE 30th International Conference in Micro Electro Mechanical Systems (MEMS). Jan. 22-26, 2017. pp. 942-945.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
G. Manohar, "Investigation of Various Surface Acoustic Wave Design Configurations for Improved Sensitivity." Doctoral dissertation, University of South Florida, USA, Jan. 2012, 7 pages.
Ekeom, D. & Dubus, Bertrand & Volatier, A.. (2006). Solidly mounted resonator (SMR) FEM-BEM simulation. 1474-1477. 10.1109/ULTSYM.2006.371.
Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.
Naumenko et al., "Optimal orientations of Lithium Niobate for resonator SAW filters", 2003 IEEE Ultrasonics Symposium-pp. 2110-2113. (Year: 2003).
Webster Dictionary "Meaning of diaphragm" Merriam Webster since 1828.
Safari et al. "Piezoelectric for Transducer Applications" published by Elsevier Science Ltd., pp. 4 (Year: 2000).
Moussa et al. Review on Triggered Liposomal Drug Delivery with a Focus on Ultrasound 2015, Bentham Science Publishers, pp. 16 (Year 2005).
"Acoustic Properties of Solids" ONDA Corporation, 592 Weddell Drive, Sunnyvale, CA 94089, Apr. 11, 2003, pp. 5 (Year 2003).
Bahreynl, B., "Fabrication and Design of Resonant Microdevices" Andrew William, Inc. 2018, NY (Year 2008).
Material Properties of Tibtech Innovations, © 2018 Tibtech Innovations (Year 2018).
Bousquet, Marie e al. "Single-mode high frequency LiNbO3 Film Bulk Acoustic Resonator," 2019 IEEE International Ultrasonics Symposium (IUS), Glasgow, Scotland, Oct. 6-9, 2019, pp. 84-87.
Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).
Yantchev, Ventsislav & Katardjiev, Ilia. (2013). Thin film Lamb wave resonators in frequency control and sensing applications: A review. Journal of Micromechanics and Microengineering. 23. 043001.10.1088/0960-1317/23/4/043001.
Wei Pang et al. "Analytical and experimental study on the second harmonic mode response of a bulk acoustic wave resonator" 2010 J. Micromech. Microeng. 20 115015; doi:10.1088/0960-1317/20/11/115015.
Durmus et al. "Acoustic-Based Biosensors" Encyclopedia of Microfluidics and Nanofluidics. DOI 10.1007/978-3-642-27758-0_10-2 Springer Science+Business Media New York 2014.
USPTO/ISA, International Search Report and Written Opinion for PCT Application No. PCT/US2023/017732 dated Jul. 27, 2023.
USPTO/ISA, International Search Report and Written Opinion for PCT Application No. PCT/US2022/082421 dated May 3, 2023.
USPTO/ISA, International Search Report and Written Opinion for PCT Application No. PCT/US2022/081095 dated May 30, 2023.
USPTO/ISA, International Search Report and Written Opinion for PCT Application No. PCT/US2022/079236 dated Mar. 10, 2023.
USPTO/ISA, International Search Report and Written Opinion for PCT Application No. PCT/US2022/081068 dated Apr. 18, 2023.
USPTO/ISA, International Search Report and Written Opinion for PCT Application No. PCT/US2022/080246 dated Mar. 30, 2023.
Gong et al., "Design and Analysis of Lithium-Niobate-Based High Electromechanical Coupling RF-MEMS Resonators for Wideband Filtering", IEEE Transactions on Microwave Theory and Techniques, vol. 61, No. 1, Jan. 2013, pp. 403-413.
International Search Report and Written Opinion in PCT/US2022/082421, mailed May 3, 2023, 16 pages.

TRANSVERSELY-EXCITED FILM BULK ACOUSTIC RESONATORS WITH GAP DIELECTRIC STRIPES IN BUSBAR-ELECTRODE GAPS

CROSS REFERENCE TO RELATED APPLICATIONS

The current application is a continuation-in-part of U.S. patent application Ser. No. 18/065,830, filed Dec. 14, 2022, entitled "TRANSVERSELY-EXCITED FILM BULK ACOUSTIC RESONATORS WITH GAP DIELECTRIC STRIPES IN BUSBAR-ELECTRODE GAPS", and which claims priority to U.S. provisional patent application No. 63/294,245, filed Dec. 28, 2021, entitled GAP OXIDE STRIP ACOUSTIC CONFINEMENT STRUCTURES FOR Y-CUT LN, and U.S. provisional patent application No. 63/322,119, filed Mar. 21, 2022, entitled "82Y CUT PLATE WITH WIDE OXIDE STRIP (WOS) FOR IMPROVED LOSS WITH FEWER 3D SPURS", the entire contents of each of which are hereby incorporated by reference.

TECHNICAL FIELD

This disclosure relates to radio frequency filters using acoustic wave resonators, and specifically to filters for use in communications equipment.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band may depend on the specific application. For example, in some cases a "pass-band" may be defined as a frequency range where the insertion loss of a filter is better than a defined value such as 1 dB, 2 dB, or 3 dB, while a "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels. As the demand for RF filters operating at higher frequencies continues to increase, there is a need for improved filters that can operate at different frequency bands while also improving the manufacturing processes for making such filters.

SUMMARY OF THE INVENTION

In an exemplary aspect, an acoustic resonator device according to the present disclosure includes: a substrate having a surface; an 82Y-cut lithium niobate piezoelectric plate attached to the surface of the substrate except for a portion of the piezoelectric plate forming a diaphragm that spans a cavity; an interdigital transducer (IDT) at the piezoelectric plate such that interleaved fingers of the IDT are disposed at the diaphragm; and a plurality of stripes of a dielectric material extending over ends of the interleaved fingers and portions of gaps between the ends of the interleaved fingers and opposing busbars of the IDT.

In another exemplary aspect, an acoustic resonator device according to the present disclosure includes: a substrate having a surface; an 82Y-cut lithium niobate piezoelectric plate attached to the surface of the substrate except for a portion of the piezoelectric plate forming a diaphragm that spans a cavity; an interdigital transducer (IDT) at the piezoelectric plate such that interleaved fingers of the IDT are disposed at the diaphragm; and at least one stripe of a dielectric material extending over ends of the interleaved fingers and a portion of a gap between the ends of the interleaved fingers and an opposing busbar facing the ends of the interleaved fingers.

In a further exemplary aspect, a method of fabricating an acoustic resonator device according to the present disclosure includes: attaching a substrate to an 82Y-cut lithium niobate piezoelectric plate; forming an interdigital transducer (IDT) on a side of the piezoelectric plate, the IDT comprising interleaved fingers, an overlapping distance of the interleaved fingers defining an aperture of the acoustic resonator device; and forming a plurality of stripes of a dielectric material over ends of the interleaved fingers and portions of gaps between the ends of the interleaved fingers and opposing busbars of the IDT.

Figure 1:
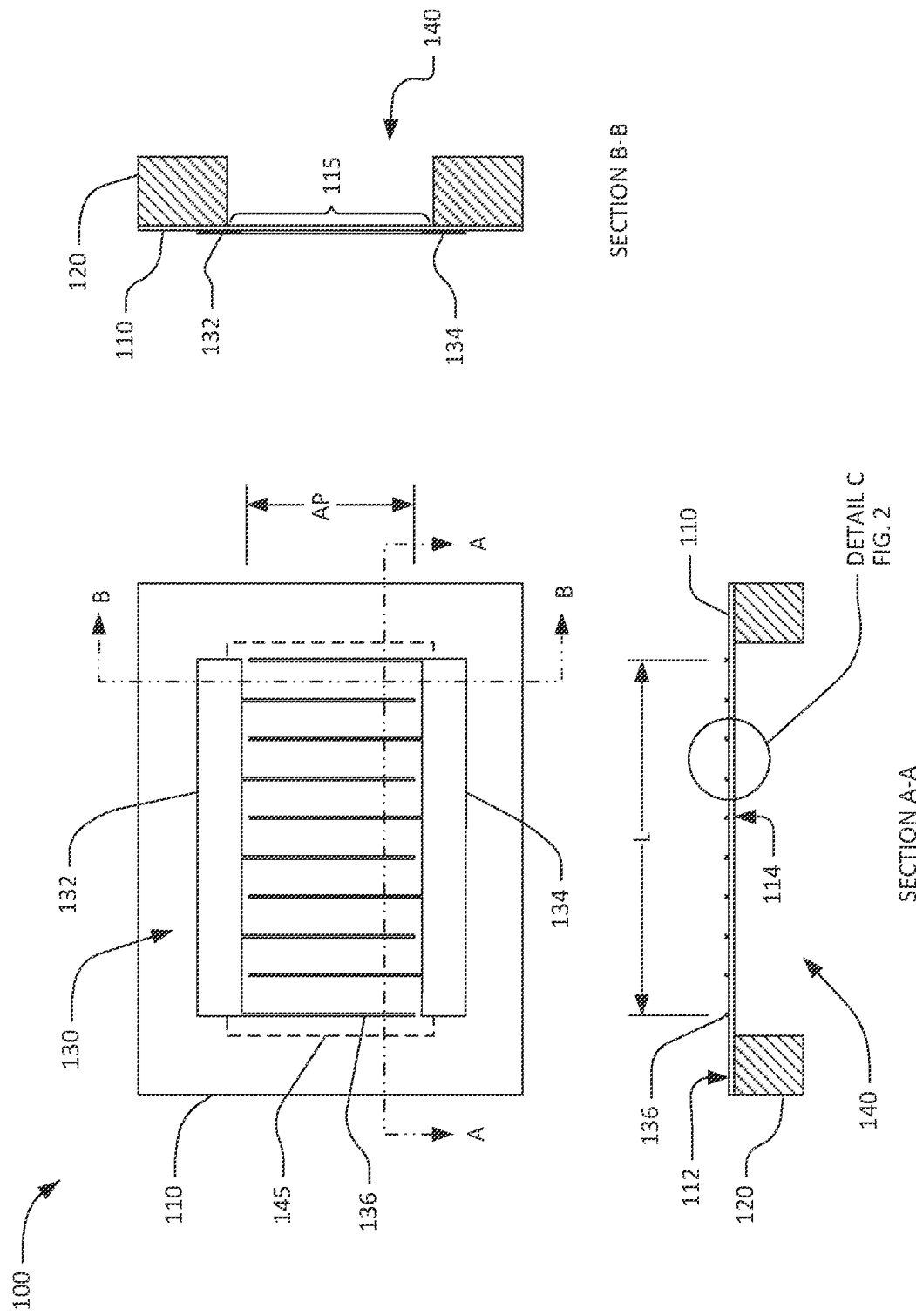
FIG. 1 includes a schematic plan view and two schematic cross-sectional views of a transversely-excited film bulk acoustic resonator (XBAR).

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

The Transversely-Excited Film Bulk Acoustic Resonator (XBAR) is a resonator structure for use in microwave filters. The XBAR is described in U.S. Pat. No. 10,491,291, titled TRANSVERSELY EXCITED FILM BULK ACOUSTIC RESONATOR, which is incorporated herein by reference in its entirety. An XBAR resonator comprises a conductor pattern having an interdigital transducer (IDT) formed on one or both surfaces of a thin floating layer or diaphragm of a piezoelectric material. The IDT has two busbars which are each attached to a set of fingers and the two sets of fingers are interleaved on the diaphragm over a cavity formed in a substrate upon which the resonator is mounted. The diaphragm spans the cavity and may include front-side and/or back-side dielectric layers. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

A piezoelectric membrane may be a part of a plate of single-crystal piezoelectric material that spans a cavity in the substrate. A piezoelectric diaphragm may be the membrane and may include front-side and/or back-side dielectric layers. An XBAR resonator may be such a diaphragm or membrane with an interdigital transducer (IDT) formed on a diaphragm or membrane.

Three dimensional simulations of XBAR devices show acoustic energy may leak from the resonator area in the transverse direction (i.e., parallel to the IDT fingers). Such leakage may cause undesired ripples in resonator admittance and increase undesired insertion loss for XBAR filters.

The following describes improved XBAR resonators, filters and fabrication techniques for XBAR resonators with gap dielectric stripes in busbar-electrode gaps. The gap dielectric stripes in busbar-electrode gaps may serve two primary purposes: 1) to remove gap mode spurs by moving them lower in frequency and (potentially) reducing their magnitude; and 2) to improve acoustic confinement and limit energy leakage to the busbar region, improving device Q.

The stripes can be structures for confining acoustic energy within the resonator area of a rotated Y-cut lithium niobate piezoelectric plate in order to reduce device losses. Using the gap dielectric stripes (as compared to not having them) can also move problematic 'gap mode' spurs (e.g., gap modes), appearing immediately above or below the resonant frequency, to a more favorable location in frequency space by lowering the frequency of the 'gap mode' spurs to a frequency of lesser concern for the filter application. In addition to altering their frequency, using gap dielectric strips can also reduce the magnitude of these problematic 'gap mode' spurs.

FIG. 1 shows a simplified schematic top view and orthogonal cross-sectional views of a transversely-excited film bulk acoustic resonator (XBAR) 100. XBAR resonators, such as the resonator 100, may be used in a variety of RF filters including band-reject filters, band-pass filters, duplexers, and multiplexers. XBARs are particularly suited for use in filters for communications bands with frequencies above 3 GHz.

In general, the XBAR 100 is made up of a thin film conductor pattern formed at one or both surfaces of a piezoelectric plate 110 having parallel front and back surfaces 112, 114, respectively (also referred to generally first and second surfaces, respectively). The piezoelectric plate is a thin single-crystal layer of a piezoelectric material, such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples described herein, the piezoelectric plates are Z-cut, which is to say the Z axis is normal to the front and back surfaces 112, 114. However, XBARs may be fabricated on piezoelectric plates with other crystallographic orientations including rotated Z-cut and rotated YX cut.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans (e.g., extends over) the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner.

"Cavity" has its conventional meaning of "an empty space within a solid body." The cavity 140 may be a hole completely through the substrate 120 (as shown in Section A-A and Section B-B) or a recess in the substrate 120 (as shown subsequently in FIG. 3A and FIG. 3B). The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

Figure 3A:
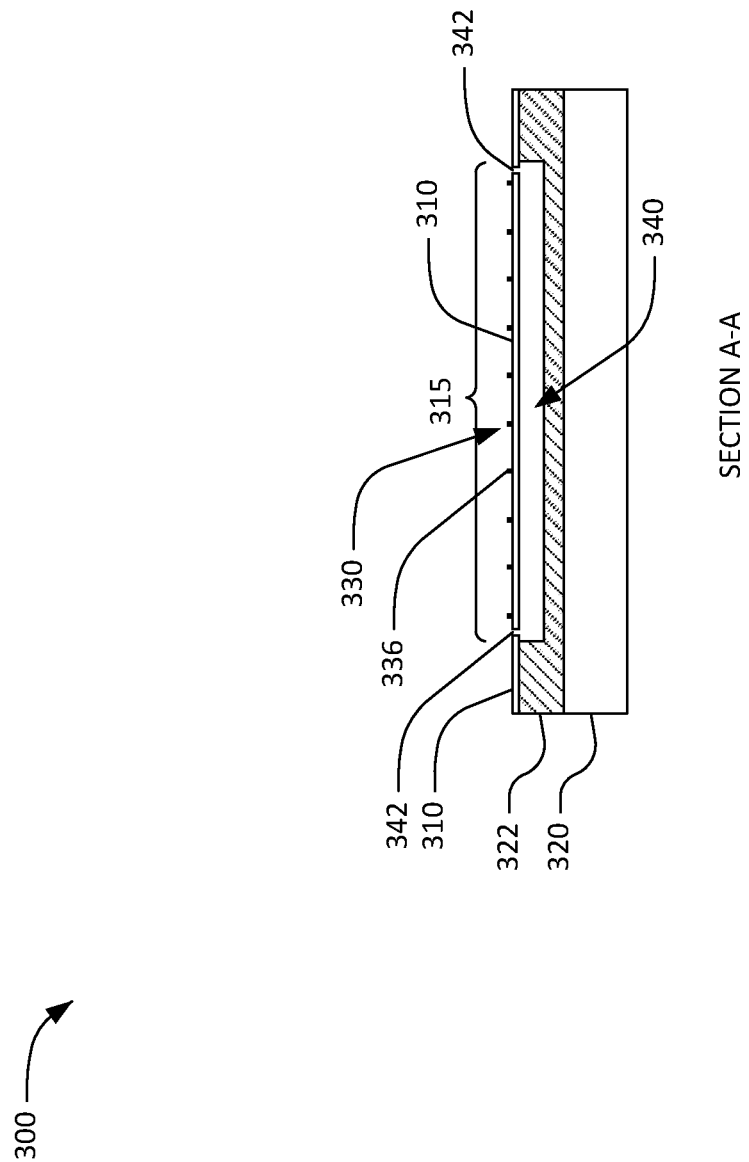
FIG. 3A is an alternative schematic cross-sectional view of an XBAR.
Figure 3B:
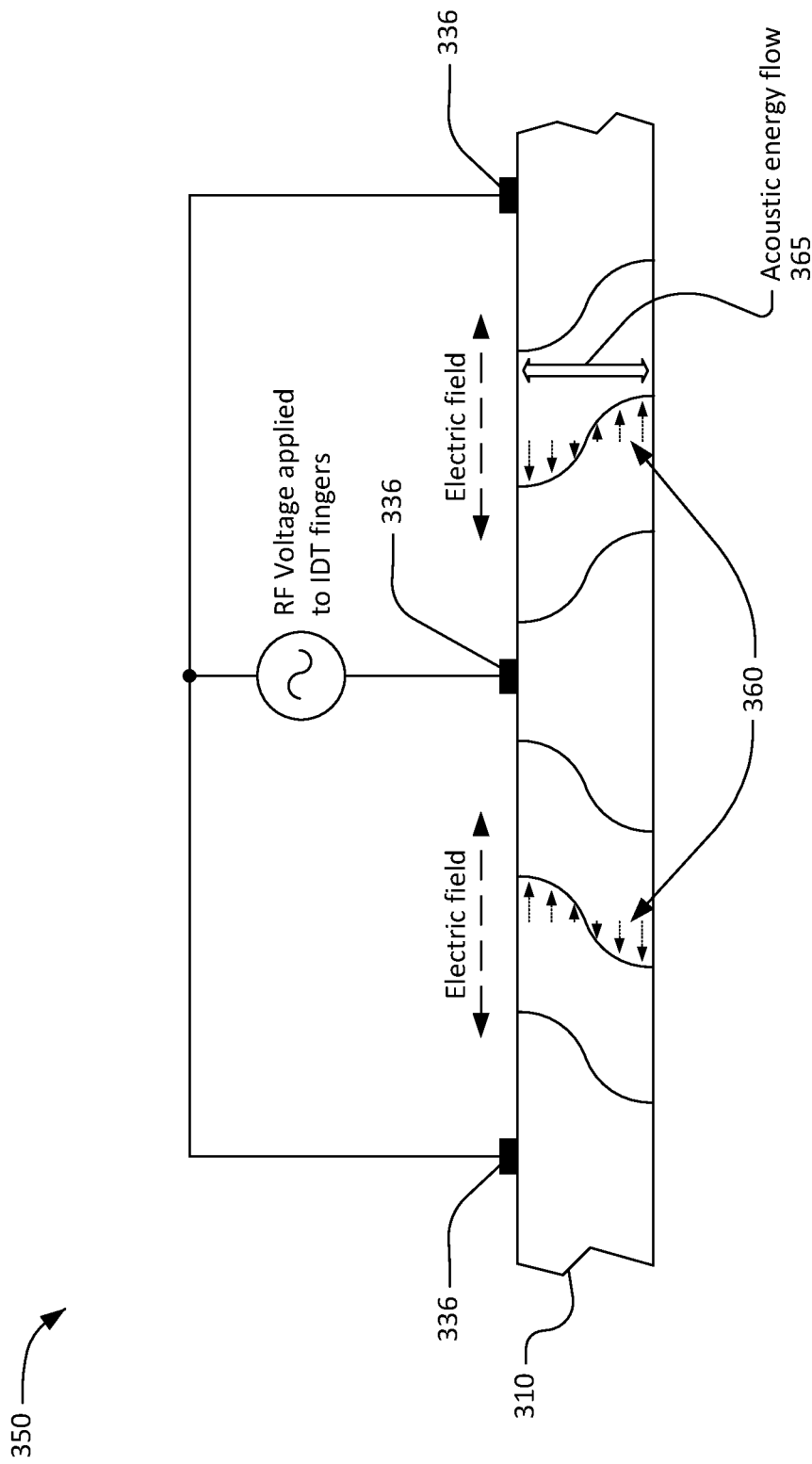
FIG. 3B is a graphical illustration of the primary acoustic mode of interest in an XBAR.

In the examples of FIG. 1, FIG. 3A. and FIG. 3B, the IDT 130 is on the front surface 112 (e.g., the first surface) of the piezoelectric plate 110. In other configurations, the IDT 130 may be on the back surface 114 (e.g., the second surface) of the piezoelectric plate 110 or on both the front and back surfaces 112, 114.

The first and second busbars 132, 134 are configured as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned at or on the piezoelectric plate 110 such that at least the fingers of the IDT 130 are extend at or on the diaphragm 115 of the piezoelectric plate that spans, or is suspended over, the cavity 140. As shown in FIG. 1, the cavity 140 has a rectangular cross section with an extent greater than the aperture AP and length L of the IDT 130. According to other exemplary aspects, the cavity of an XBAR may have a different cross-sectional shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT. For example, an XBAR may have hundreds, possibly thousands, of parallel fingers in the IDT according to exemplary aspects. Similarly, the thickness of the fingers in the cross-sectional views is greatly exaggerated.

Figure 2A:
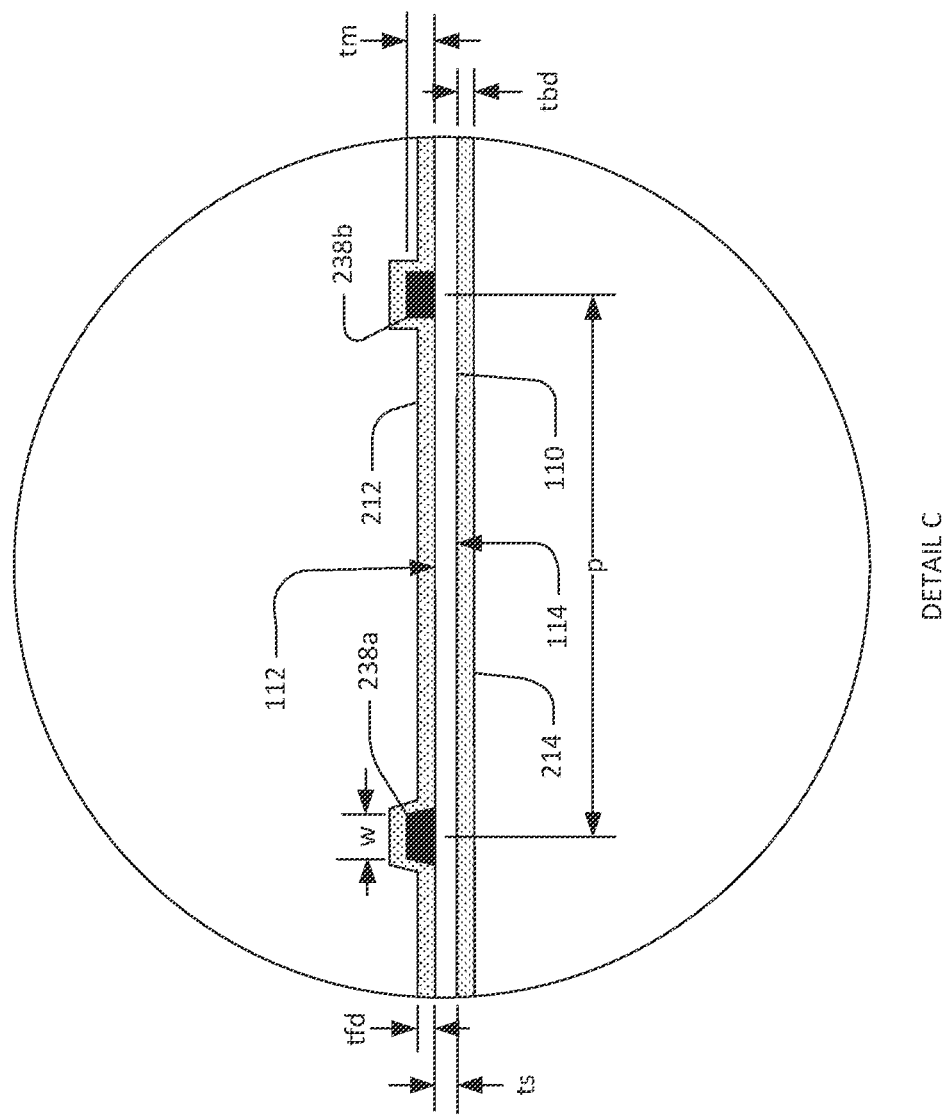
FIG. 2A is an expanded schematic cross-sectional view of a portion of the XBAR of FIG. 1.

FIG. 2A shows a detailed schematic cross-sectional view of the XBAR 100 of FIG. 1. The piezoelectric plate 110 is a single-crystal layer of piezoelectrical material having a thickness ts. ts may be, for example, 100 nm to 1500 nm. When used in filters for 5G NR and Wi-Fi™ bands from 3.4 GHZ to 7 GHz, the thickness ts may be, for example, 150 nm to 500 nm.

A front-side dielectric layer 212 (e.g., a first dielectric coating layer or material) can be formed on the front side 112 of the piezoelectric plate 110. The "front side" of the XBAR is, by definition, the surface facing away from the substrate. The front-side dielectric layer 212 has a thickness tfd. As shown in FIG. 2A the front-side dielectric layer 212 covers the IDT fingers 238a, 238b. Although not shown in FIG. 2A, the front side dielectric layer 212 may also be deposited only between the IDT fingers 238a, 238b. In this case, an additional thin dielectric layer (not shown) may be deposited over the IDT fingers to seal and passivate the fingers.

A back-side dielectric layer 214 (e.g., a second dielectric coating layer or material) can be formed on the back side 114 of the piezoelectric plate 110. In general, for purposes of this disclosure, the term "back-side" means on a side opposite the front-side dielectric layer 212. Moreover, the back-side dielectric layer 214 has a thickness tbd. The front-side and back-side dielectric layers 212, 214 may be a non-piezo-electric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 212, 214 are not necessarily the same material. Either or both of the front-side and back-side dielectric layers 212, 214 may be formed of multiple layers of two or more materials according to various exemplary aspects.

The IDT fingers 238a, 238b may be aluminum, substantially aluminum alloys, copper, substantially copper alloys, beryllium, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers. The cross-sectional shape of the IDT fingers may be trapezoidal (finger 238a), rectangular (finger 238b) or some other shape.

Figure 2C:
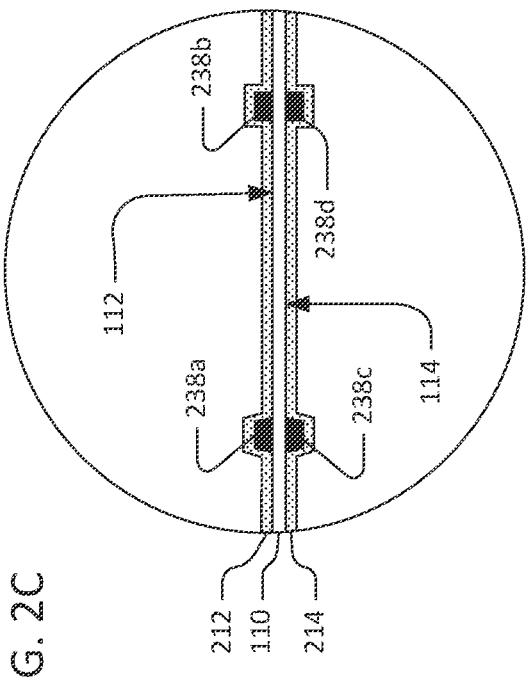
FIG. 2C is an expanded schematic cross-sectional view of another alternative configuration of the XBAR of FIG. 1.
Figure 2B:
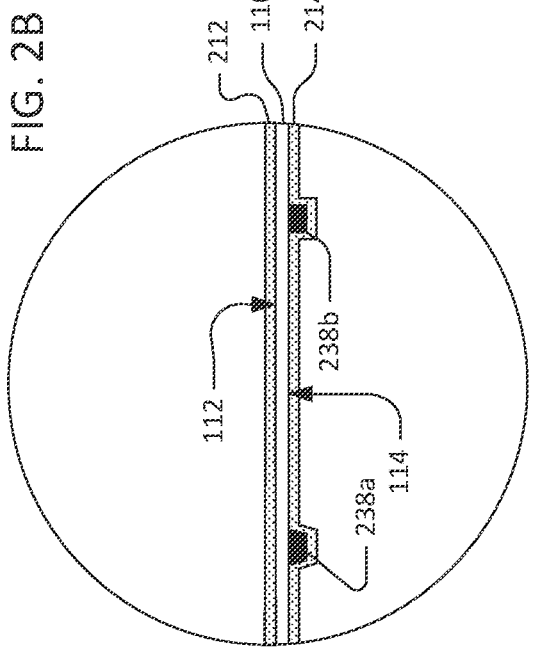
FIG. 2B is an expanded schematic cross-sectional view of an alternative configuration of the XBAR of FIG. 1.

Dimension p is the center-to-center spacing between adjacent IDT fingers, such as the IDT fingers 238a, 238b in FIGS. 2A, 2B, and 2C. The center-to-center spacing may be constant over the length of the IDT, in which case the dimension p may be referred to as the pitch of the IDT and/or the pitch of the XBAR. The center-to-center spacing may vary along the length of the IDT, in which case the pitch of the IDT is the average value of dimension p over the length of the IDT. Each IDT finger, such as the IDT fingers 238a, 238b in FIGS. 2A, 2B, and 2C, has a width w measured normal to the long direction of each finger. The width w may also be referred to herein as the "mark." The width of the IDT fingers may be constant over the length of the IDT, in which case the dimension w is the width of each IDT finger. The width of individual IDT fingers may vary along the length of the IDT 130, in which case dimension w is the average value of the widths of the IDT fingers over the length of the IDT. Note that the pitch p and the width w of the IDT fingers are measured in a direction parallel to the length L of the IDT, as defined in FIG. 1.

The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric plate 110. Moreover, the width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, less than, greater than, or any combination thereof, the thickness tm of the IDT fingers.

Moreover, unlike a SAW filter, the resonance frequency of an XBAR is dependent on the total thickness of its diaphragm (i.e., in the vertical or thickness direction), including the piezoelectric plate 110, and the front-side and back-side dielectric layers 212, 214 disposed thereon. As described in more detail below, the thickness of one or both dielectric layers can be varied to change the resonance frequencies of various XBARs in a filter. For example, shunt resonators in a ladder filter circuit may incorporate thicker dielectric layers to reduce the resonance frequencies of the shunt resonators relative to series resonators with thinner dielectric layers, and thus, a thinner overall thickness.

Thus, as will be described in detail below, a filter device including a plurality of acoustic resonators and a method for manufacturing the same is provided for applying a single dielectric coating (e.g., SiO2 or SiN) on the front-side of the diaphragm to initially provide a plurality of resonators on the same die. The single dielectric coating can then be etched (or otherwise removed) to form different binary dielectric layer thicknesses after etching for different resonators, and thus, the same filter device can be manufactured with a plurality of acoustic resonators operating at different resonance frequencies due to the different configurations of passivation layers over each resonator, respectively. As a result, the acoustic resonator device and a method for manufacturing the same described below make it unnecessary to use more than two thicknesses of a dielectric layer to differentiate resonator characteristics. As will become apparent from the description below, by implementing a patterned dielectric layer of two thickness, a minimum thickness and a maximum thickness, reduces the manufacturing cost and complexity, and increasing yield. That is, a stepped binary dielectric layer thickness can be lithographically patterned to create any number of different desired effective thicknesses from a single masking and etching step, as described below.

Referring back to FIG. 2A, the thickness tfd of the front-side dielectric layer 212 over the IDT fingers 238a, 238b may be greater than or equal to a minimum thickness required to passivate the IDT fingers and other conductors on the front side 112 to the piezoelectric plate 110. The minimum thickness may be, for example, 10 nm to 50 nm depending on the material of the front side dielectric layer and method of deposition according to an exemplary aspect. The thickness of the back-side dielectric layer 214 may be configured to specific thickness to adjust the resonance frequency of the resonator as will be described in more detail below.

Although FIG. 2A discloses a configuration in which IDT fingers 238a and 238b are on the front side 112 of the piezoelectric plate 110, alternative configurations can be provided. For example, FIG. 2B shows an alternative configuration in which the IDT fingers 238a, 238b are on the back side 114 of the piezoelectric plate 110 and are covered by a back-side dielectric layer 214. A front side dielectric layer 212 may cover the front side 112 of the piezoelectric plate 110. As described below, a dielectric layer disposed on the diaphragm of each resonator can be trimmed or etched to adjust the resonant frequency. However, if the dielectric layer is on the side of the diaphragm facing the cavity, there may be a change in spurious modes (e.g., generated by the coating on the fingers), which would need to be addressed. Moreover, with the passivation layer coated on top of the IDTs, the mark changes, which can also cause spurs. Therefore, disposing the IDT fingers 238a, 238b on the back side 114 of the piezoelectric plate 110 as shown in FIG. 2B may eliminate the need to address both the change in frequency as well as the effect it has on spurs as compared when the IDT fingers 238a and 238b are on the top front side 112 of the piezoelectric plate 110.

FIG. 2C shows an alternative configuration in which IDT fingers 238a, 238b are on the front side 112 of the piezoelectric plate 110 and are covered by a front-side dielectric layer 212. IDT fingers 238c, 238d are on the back side 114 of the piezoelectric plate 110 and are covered by a back-side dielectric layer 214. As previously described, the front-side and back-side dielectric layer 212, 214 are not necessarily the same thickness or the same material.

Figure 2D:
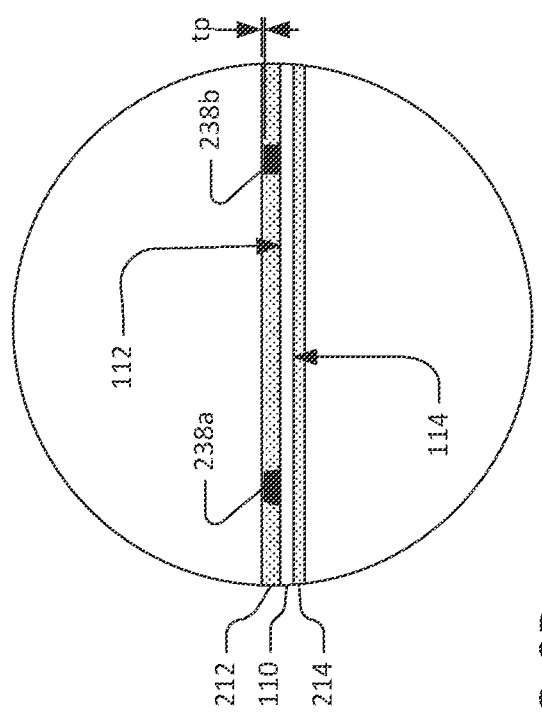
FIG. 2D is an expanded schematic cross-sectional view of another alternative configuration of the XBAR of FIG. 1.

FIG. 2D shows another alternative configuration in which IDT fingers 238a, 238b are on the front side 112 of the piezoelectric plate 110 and are covered by a front-side dielectric layer 212. The surface of the front-side dielectric layer is planarized. The front-side dielectric layer may be planarized, for example, by polishing or some other method. A thin layer of dielectric material having a thickness tp may cover the IDT finger 238a, 238b to seal and passivate the fingers. The dimension TP may be, for example, 10 nm to 50 nm.

FIG. 3A is an alternative cross-sectional view of XBAR device 300 along the section plane A-A defined in FIG. 1. In FIG. 3A, a piezoelectric plate 310 is attached to an intermediate layer 322 of a substrate 320. A portion of the piezoelectric plate 310 forms a diaphragm 315 spanning a cavity 340 in the substrate. The cavity 340, does not fully penetrate the intermediate layer 322 in FIG. 3A, and is formed in the layer 322 under the portion of the piezoelectric plate 310 containing the IDT 330 of a conductor pattern (e.g., first metal or M1 layer) of an XBAR. Fingers, such as finger 336, of an IDT are disposed on the diaphragm 315. Interconnection of the IDT (e.g., busbars) 330 to signal and ground paths may be through a second conductor pattern (e.g., an M2 metal layer, not shown in FIGS. 1-3A) to other conductor patterns and/or to electrical contacts on a package.

Plate 310, diaphragm 315 and fingers 336 may be plate 110, diaphragm 115 and fingers 136 (or 236). The cavity 340 may be formed, for example, by etching the substrate 320 before attaching the piezoelectric plate 310. Alternatively, the cavity 340 may be formed by etching the substrate 320 with a selective etchant that reaches the substrate through one or more openings 342 provided in the piezoelectric plate 310. The diaphragm 315 may be contiguous with the rest of the piezoelectric plate 310 around a large portion of a perimeter of the cavity 340. For example, the diaphragm 315 may be contiguous with the rest of the piezoelectric plate 310 around at least 50% of the perimeter of the cavity 340.

Intermediate layer 322 may be one or more intermediate material layers attached between plate 310 and substrate 320. An intermediary layer may be or include a bonding layer, a BOX layer, an etch stop layer, a sealing layer, an adhesive layer or layer of other material that is attached or bonded to plate 310 and substrate 320. A layer of layers 322 may be a dielectric, an oxide, a silicon oxide, silicon nitride, an aluminum oxide, silicon dioxide or silicon nitride. Layers 322 may be one or more of any of these layers or a combination of these layers.

While the cavity 340 is shown in cross-section, it should be understood that the lateral extent of the cavity is a continuous closed band area of layer 322 that surrounds and defines the size of the cavity 340 in the direction normal to the plane of the drawing. The lateral (i.e. left-right as shown in the figure) extent of the cavity 340 is defined by the lateral edges layer 322. The vertical (i.e. down from plate 310 as shown in the figure) extent or depth of the cavity 340 into layer 322. In this case, the cavity 340 has a side cross-section rectangular, or nearly rectangular, cross section.

The XBAR 300 shown in FIG. 3A will be referred to herein as a "front-side etch" configuration since the cavity 340 is etched from the front side of the layer 322 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110. The XBAR 300 shows one or more openings 342 in the piezoelectric plate 310 at the left and right sides of the cavity 340. However, in some cases openings 342 in the piezoelectric plate 310 are only at the left or right side of the cavity 340.

As shown, XBAR 300 comprises a substrate that includes a base 320 and an intermediate layer 322 that is disposed between the piezoelectric plate 310 and the base 320. For example, the base 320 may be silicon and the intermediate layer 322 may be silicon dioxide or silicon nitride or some other material, e.g., an intermediate dielectric layer. That is, in this aspect, the base 320 and the intermediate layer 322 are collectively considered the substrate. Although not shown in FIG. 3A, the substrate may include more than one intermediate layers between the base 320 and the piezoelectric plate 310. As further shown, cavity 340 is formed in the intermediate layer 322 under the portion of the piezoelectric plate 310 containing the IDT fingers of an XBAR. The cavity 340 may be formed, for example, by etching the intermediate layer 322 before attaching the piezoelectric plate 310. Alternatively, the cavity 340 may be formed by etching the intermediate layer 322. In some cases, the etching may be performed with a selective etchant that reaches the substrate through one or more openings (not shown) provided in the piezoelectric plate 310. In this case, the diaphragm 315, which can correspond to diaphragm 115 of FIG. 1 in an exemplary aspect, may be contiguous with the rest of the piezoelectric plate 310 around a large portion of a perimeter of the cavity 340. For example, the diaphragm 315 may be contiguous with the rest of the piezoelectric plate 310 around at least 50% of the perimeter of the cavity 340. As shown in FIG. 3A, the cavity 340 extends completely through the intermediate layer 322. That is, the diaphragm 315 can have an outer edge that faces the piezoelectric plate 310 with at least 50% of the edge surface of the diaphragm 315 coupled to the edge of the piezoelectric plate 310 facing the diaphragm 315. This configuration provides for increased mechanical stability of the resonator.

In other configurations, the cavity 340 may extend into, but not though the intermediate layer 322 (i.e., the intermediate layer 322 may extend over the bottom of the cavity on top of the base 320), or may extend through the intermediate layer 322 into the base 320.

FIG. 3B is a graphical illustration of the primary acoustic mode of interest in an XBAR. FIG. 3B shows a small portion of an XBAR 350 including a piezoelectric plate 310 and three interleaved IDT fingers 336. In general, the exemplary configuration of XBAR 300 can correspond to any of the configurations described above and shown in FIGS. 2A to 2D according to an exemplary aspect. Thus, it should be appreciated that piezoelectric plate 310 can correspond to piezoelectric plate 310 and IDT fingers 330 can be implemented according to any of the configurations of fingers 238a and 238b, for example.

In operation, an RF voltage is applied to the interleaved fingers 330. This voltage creates an electric field, such as a time-varying electric field, between the fingers. The direction of the electric field is lateral, or parallel to the surface of the piezoelectric plate 310, as indicated by the arrows labeled "electric field". Due to the high dielectric constant of the piezoelectric plate 310, the electric field is highly concentrated in the plate relative to the air. The lateral electric field introduces shear deformation in the piezoelectric plate 310, and thus strongly excites a shear-mode acoustic mode, in the piezoelectric plate 310. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 300 are represented by the curves 360, with the adjacent small arrows providing a schematic indication of the direction and magnitude of atomic motion. It is noted that the degree of atomic motion, as well as the thickness of the piezoelectric plate 310, have been exaggerated for ease of visualization in FIG. 3B. While the atomic motions are predominantly lateral (i.e., horizontal as shown in FIG. 3B), the direction of acoustic energy flow of the excited primary shear acoustic mode is substantially orthogonal to the surface of the piezoelectric plate, as indicated by the arrow 365.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. Thus, high piezoelectric coupling enables the design and implementation of microwave and millimeter-wave filters with appreciable bandwidth.

Figure 4A:
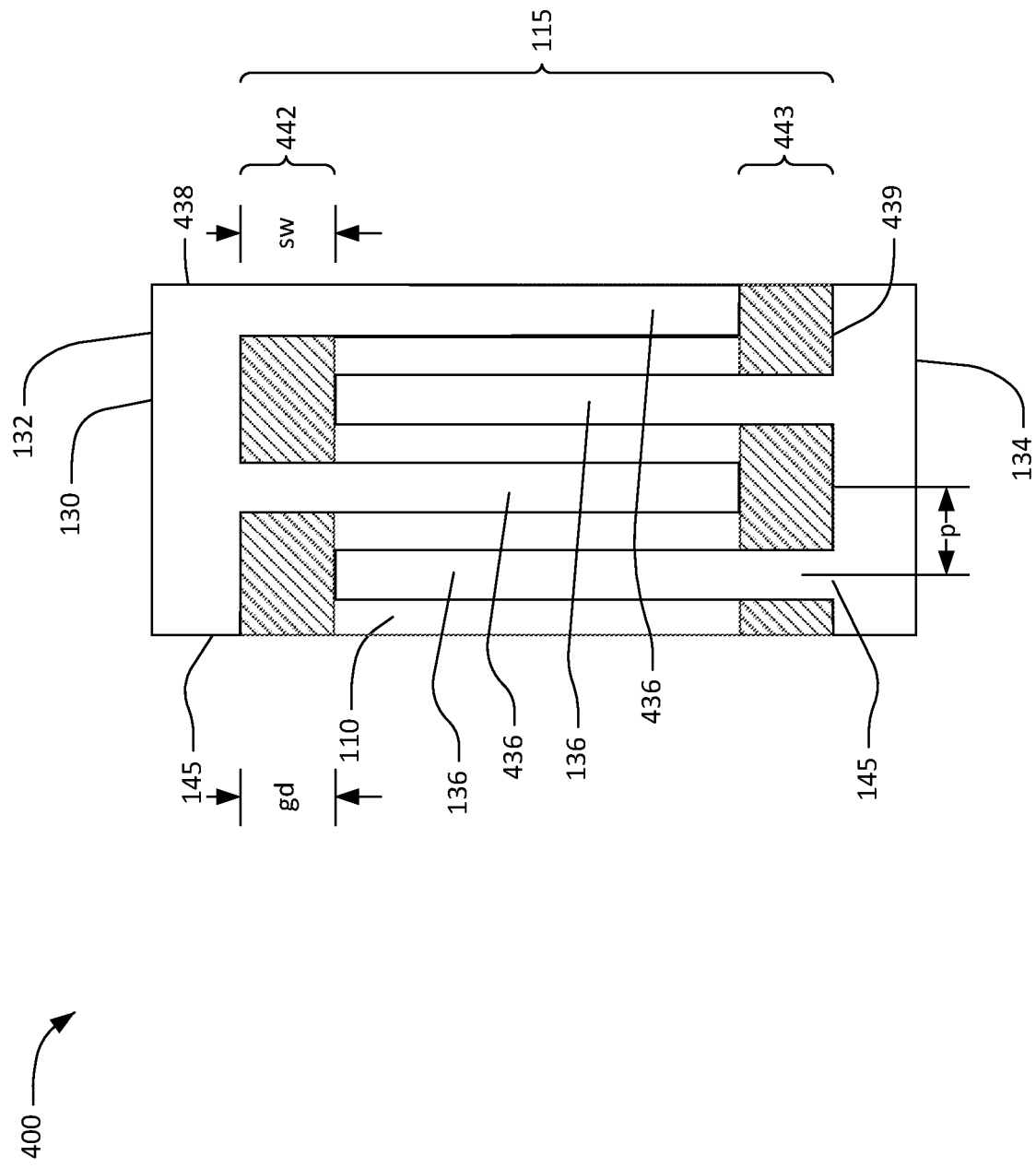
FIG. 4A shows a simplified schematic cross-sectional view of XBARs with gap dielectric stripes in busbar-electrode gaps.

FIG. 4A shows a simplified schematic top view of an XBAR 400 with gap dielectric stripes in busbar-electrode gaps. The XBAR Device 400 may represent a version of device 100, 300 and/or 350 and having gap dielectric stripes 438 and 439 in busbar-electrode (BE) gaps 442 and 443 between ends of interleaved fingers 136 and opposing busbar 132 and between ends of interleaved fingers 436 and opposing busbar 134, respectively. XBAR device 400 may be a shunt or ground resonators of a filter device having serial resonators as described for FIG. 5.

Dielectric stripes 438 and 439 may be in addition to a frontside dielectric or a passivation layer formed on the plate. Dielectric stripes 438 and 439 may be formed below a frontside dielectric or a passivation layer. Dielectric stripes 438 and 439 may be touching the fingers and the opposing busbars, such that strip width sw is equal to gap distance gd. In other cases, the stripes touch only one of or neither of the fingers or the opposing busbars, such that strip width sw is less than gap distance gd. It is considered that only one stripe may exist in device 400.

Figure 4B:
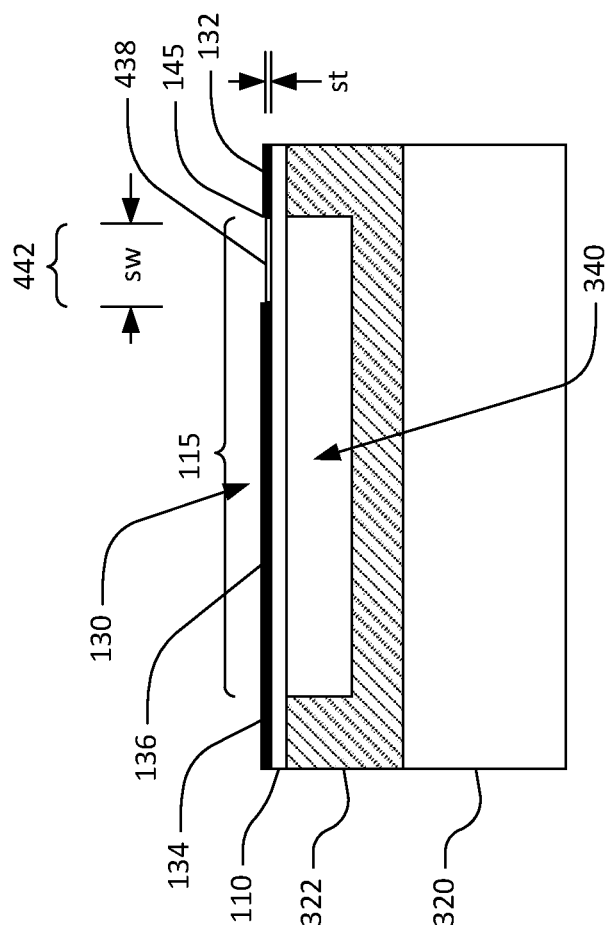
FIG. 4B shows a simplified schematic cross-sectional side view of the XBAR 400 with gap dielectric stripes in busbar-electrode gaps.

FIG. 4B shows a simplified schematic cross-sectional side view of the XBAR device 400 with gap dielectric stripes in busbar-electrode gaps. FIG. 4B is from perspective or section B-B as shown in FIG. 1. FIG. 4B does not show stripes 439 to avoid confusion. In an exemplary aspect, FIG. 4B shows busbar 134 continuous with or formed of the same metal layer as fingers 136.

XBAR device 400 is part of an acoustic resonator device having a substrate 320 with an intermediary layer 322, as described above with respect to FIG. 3A, having a surface upon which a piezoelectric plate 110 having front and back surfaces has its back surface mounted. For device 400, plate 110 is an 82Y-cut lithium niobate plate. The back surface of plate 110 attached to the top surface of the intermediary layer 322 except for a portion of the piezoelectric plate forming a diaphragm 115 that spans a 140 cavity in the intermediary layer 322.

An IDT 130 is formed on the front surface of the piezoelectric plate facing away from the cavity 140 such that interleaved fingers 136 and 436 of the IDT are disposed on the diaphragm 115. The overlapping distance of the interleaved fingers defining an aperture of the resonator device. The IDT 130 includes a set of the interleaved fingers 136 attached to and extending from a busbar 134 that opposes a set of the interleaved fingers 436, and a set of the interleaved fingers 436 attached to and extending from a busbar 132 that opposes a set of the interleaved fingers 136 (e.g., such as noted in FIG. 1). During use, the busbars 132 and 134 may be connected to opposing signal connections, or input and output filter connections.

The perimeter 145 of the cavity 140 and diaphragm 115 are defined by the intersection of the cavity and the surface of the intermediary layer 322. The XBAR device 400 has an IDT pitch p similar to devices 100, 300 and 350 that is a center-to-center spacing between adjacent ones of the interleaved fingers 136 and 436. A radio frequency signal applied to the IDT 130 of device 400 excites a primary shear acoustic mode in the piezoelectric plate 110 over the cavity 140.

In an exemplary aspect, XBAR device 400 may have a gap distance of between 2 and 5 um. The gap distance gd may be from the tip of the finger ends to the nearest surface of the opposing busbar. Gap distance gd may be as described for FIG. 1-2. Gap distance gd may be the pitch p minus a width w of the fingers.

Dielectric stripe 438 includes or is a stripe of dielectric material formed over the plate 110 in a BE gap 442 and over the interleaved fingers 436 in a BE gap 442 between ends of the interleaved fingers 136 and the opposing (e.g., adjacent to the ends of the fingers 436) busbar 132. Dielectric stripe 438 includes or is a stripe of dielectric material formed at or over the plate 110 in a BE gap 442 and over the interleaved fingers 136 in a BE gap 442 between ends of the interleaved fingers 436 and the opposing busbar 134. In other cases, the stripes 438 and 439 may not be formed over the fingers in gaps 442 and 443, respectively. In some cases, the stripes extend partially over the finger ends and/or over the busbars. The stripes 438 and 439 may be rectangular strip shapes of material between flat shaped ends of the interleaved fingers and flat shaped inner surfaces of opposing busbars.

An overlapping distance of the interleaved fingers defines an aperture of the resonator device as shown in FIG. 1. The stripes 438 and 439 reduce acoustic energy leakage from the aperture (e.g., from a resonator or resonating area) in a transverse direction that is parallel to a length of the interleaved fingers. This may be true of one stripe in a single stripe device.

In an exemplary aspect, the stripes 438 and 439 have a width sw of between 2 um and 5 um, with the width being perpendicular to a lengthwise direction of the interleaved fingers. Moreover, the stripes 438 and 439 have a thickness st of between 10 um and 50 nm, with the thickness being in a direction normal to the surface of the substrate. Furthermore, the dielectric material of the stripes 438 and 439 can be $SiO_2$, $Si_3N_4$, or AlN. Moreover, these stripes can be a combination of layers of these materials and/or a combination of these materials. XBAR device 400 may have a BE gap distance of 3 um and thickness st of 25 nm thickness.

During use of XBAR device 400, a radio frequency signal applied to the IDT 130 (e.g., to busbar 132 and/or 134) excites a primary shear acoustic mode in the piezoelectric plate over the cavity. During use of the resonator, the stripes 438 and 439 lower an amplitude of and a frequency range of output gap mode spurs that appearing immediately above the resonant frequency. The stripes 438 and 439 can be structures for confining acoustic energy within the aperture or membrane (e.g., resonating area) of a rotated Y-cut lithium niobate piezoelectric plate 110. Using the gap dielectric stripes moves problematic 'gap mode' spurs (e.g., gap modes), appearing immediately above the resonant frequency, to a more favorable location in frequency space by lowering the frequency of the 'gap mode' spurs to a frequency of lesser concern for the filter application.

Figure 4C:
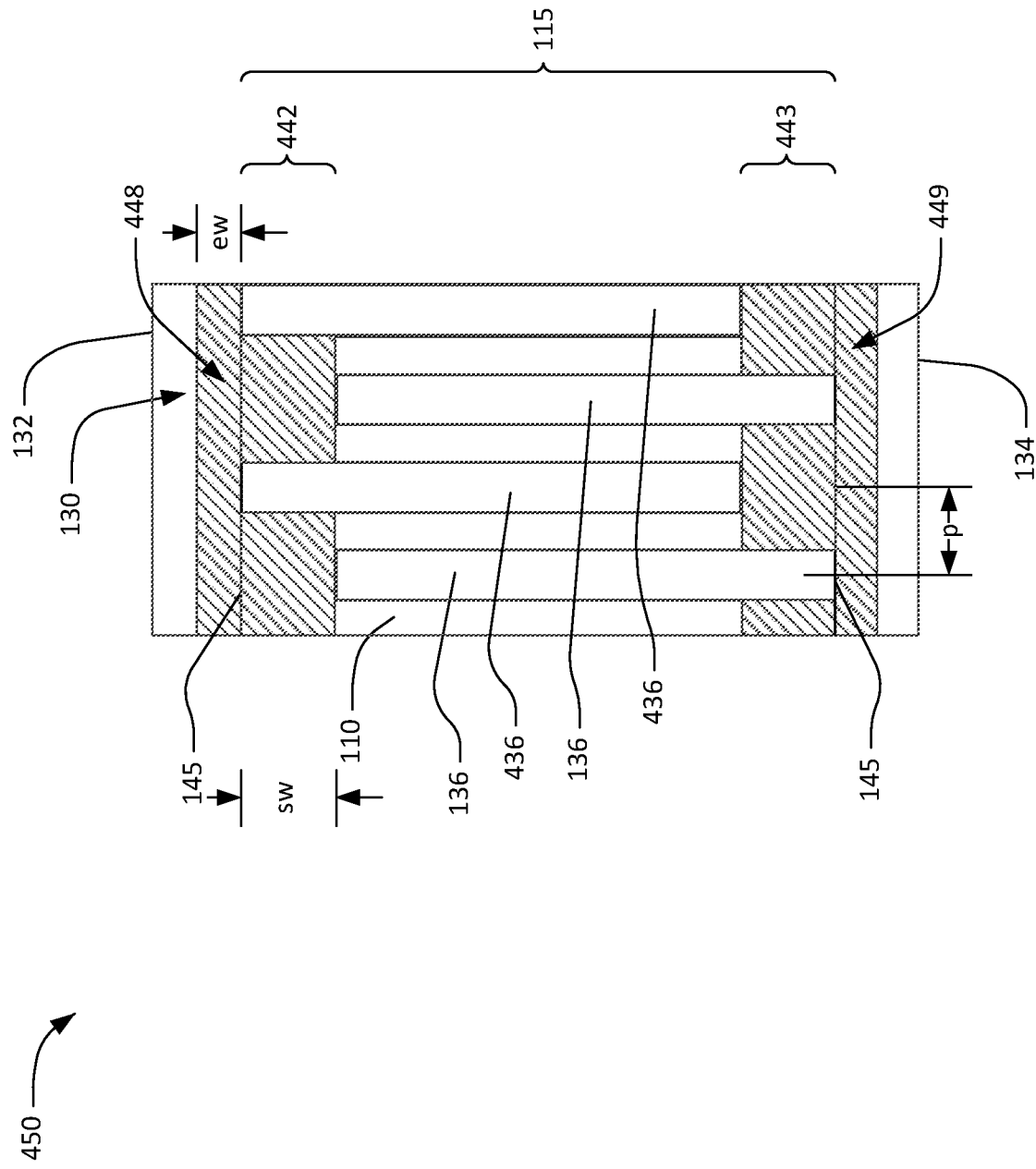
FIG. 4C shows a simplified schematic top view of an XBAR with gap dielectric stripes in busbar-electrode gaps and extending over busbars.

In XBAR device 400, the stripes 438 and 439 are located solely within the BE gaps 442 and 443. However, as shown in FIG. 4C, in XBAR 450, the stripes 448 and 449 may extend over a width ew of the busbars 132 and 134. XBAR 450 may be the same as XBAR 400, except for the stripes extending additional width ew over the busbars, in addition to width sw.

Figure 4D:
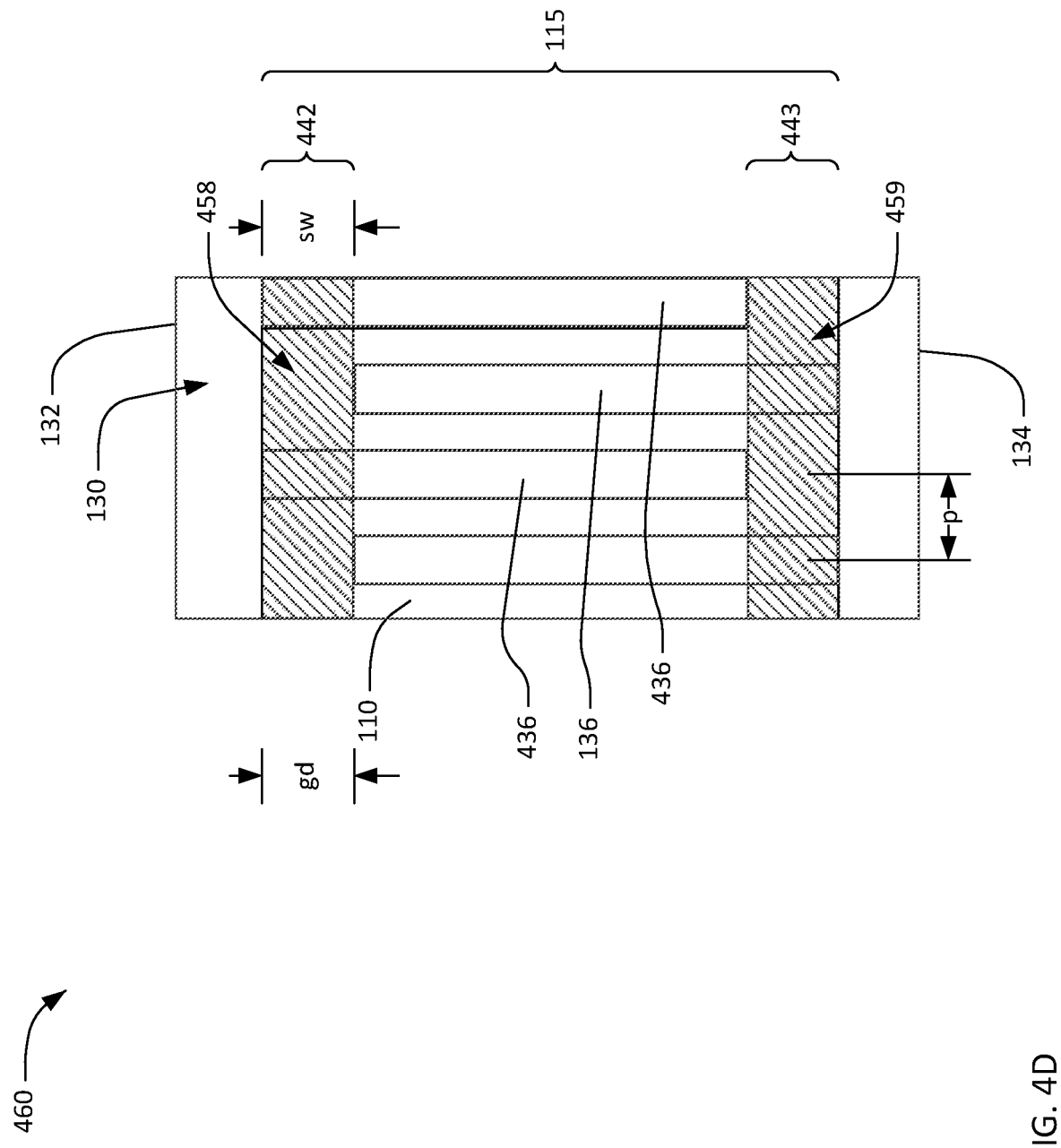
FIG. 4D shows a simplified schematic cross-sectional view of XBARs with gap dielectric stripes in busbar-electrode gaps but not over the fingers.

FIG. 4D shows a simplified schematic top view of an XBAR 460 with gap dielectric stripes in busbar-electrode gaps. As shown, XBAR device 460 may represent a version of device 400 having gap dielectric stripes 458 and 459 that do not overlap the fingers in busbar-electrode (BE) gaps 442 and 443 between ends of interleaved fingers 136 and opposing busbar 132 and between ends of interleaved fingers 436 and opposing busbar 134, respectively. Device 460 may be a shunt or ground resonators of a filter device having serial resonators as described for FIG. 5.

Dielectric stripe 458 includes or is a stripe of dielectric material formed over the plate 110 in a BE gap 442 but not over the interleaved fingers 436 in a BE gap 442 between ends of the interleaved fingers 136 and the opposing (e.g., adjacent to the ends of the fingers 436) busbar 132. Dielectric stripe 459 includes or is a stripe of dielectric material formed over the plate 110 in a BE gap 443 but not over the interleaved fingers 136 in a BE gap 443 between ends of the interleaved fingers 436 and the opposing busbar 134.

Figure 4E:
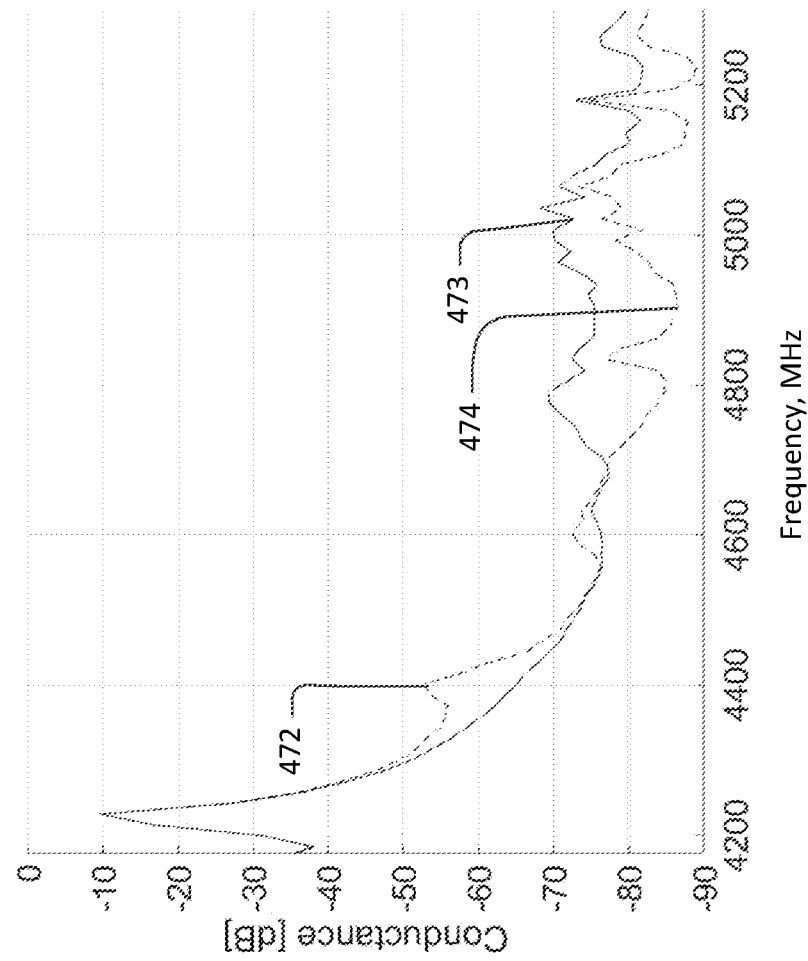
FIG. 4E is a chart of the conductance of the input-output transfer function.

FIG. 4E is a chart 402 of the conductance of the input-output transfer function, of two shunt Y-cut XBAR resonators as functions of frequency. Chart 402 shows the normalized magnitude of conductance (on a logarithmic scale) as a function of frequency for the XBAR devices simulated using finite element method (FEM) simulation techniques. Chart 402 shows a solid line of conductance for an XBAR having a BE gap distance of 1 um, and a dashed line of conductance for an XBAR having a BE gap distance of 3 um.

The two XBARS may be a version of an XBAR having a 362 nm thick, 128-Y cut $LiNbO_3$ plate; a 130 nm $SiO_2$ dielectric coating intermediary layer 322; a pitch p=4.4 um; a mark=0.9 um; and an IDT of 500 nm thick Al electrodes. These Y-cut XBAR resonators suffer two deleterious effects due to '3D' effects relating to the finite aperture of the devices. First, they suffer a conspicuous set of 'gap mode' spurs, appearing immediately above the resonant frequency such as at 472. Second, at 473 they suffer a broad-band loss appearing above the anti-resonance frequency. For example, feature 472 may sit at an n79 lower band edge, while feature 473 may sit at the n79 upper band edge.

By tuning the BE gap between 1 um and 3 um, one of feature 472 or 473 can be minimized at the expense of the other. Notably, the BE gap of 3 um resonator has a spur at 472, but has less spurs at 4743. However, if both features 472 and 473 lie at undesirable frequencies for a filter application, optimization becomes complex because one feature gets worse while making the other better. Thus, a better solution than this tradeoff may be desired.

A solution is to use the XBAR with gap dielectric stripes in busbar-electrode gaps as noted herein. This way, the BE gap distance gd can be tuned (e.g., increased from 1 um) to the 3 um larger gap to reduce the loss at 473; and the stripes 438 and 439 can be used (e.g., added to the XBAR) to move away from and/or reduce the spurs at 472. Using the gap dielectric stripes (as compared to not having them) may move problematic 'gap mode' spurs (e.g., gap modes) at 472, appearing immediately above the resonant frequency, to a more favorable location in frequency space by lowering the frequency of the 'gap mode' spurs to a frequency of lesser concern for the filter application.

In one example, the stripes are gap oxide strips located solely within the BE gaps of the IDT so as to influence only the problematic 'gap mode' spurs at 472. This influencing may be lowering the frequency of the 'gap mode' spurs so they are engineered to a frequency of lesser concern for the filter application. This allows the use of a larger BE gap, such as gd=3 um, to minimize losses in region 473, which improves overall filter performance.

Figure 4F:
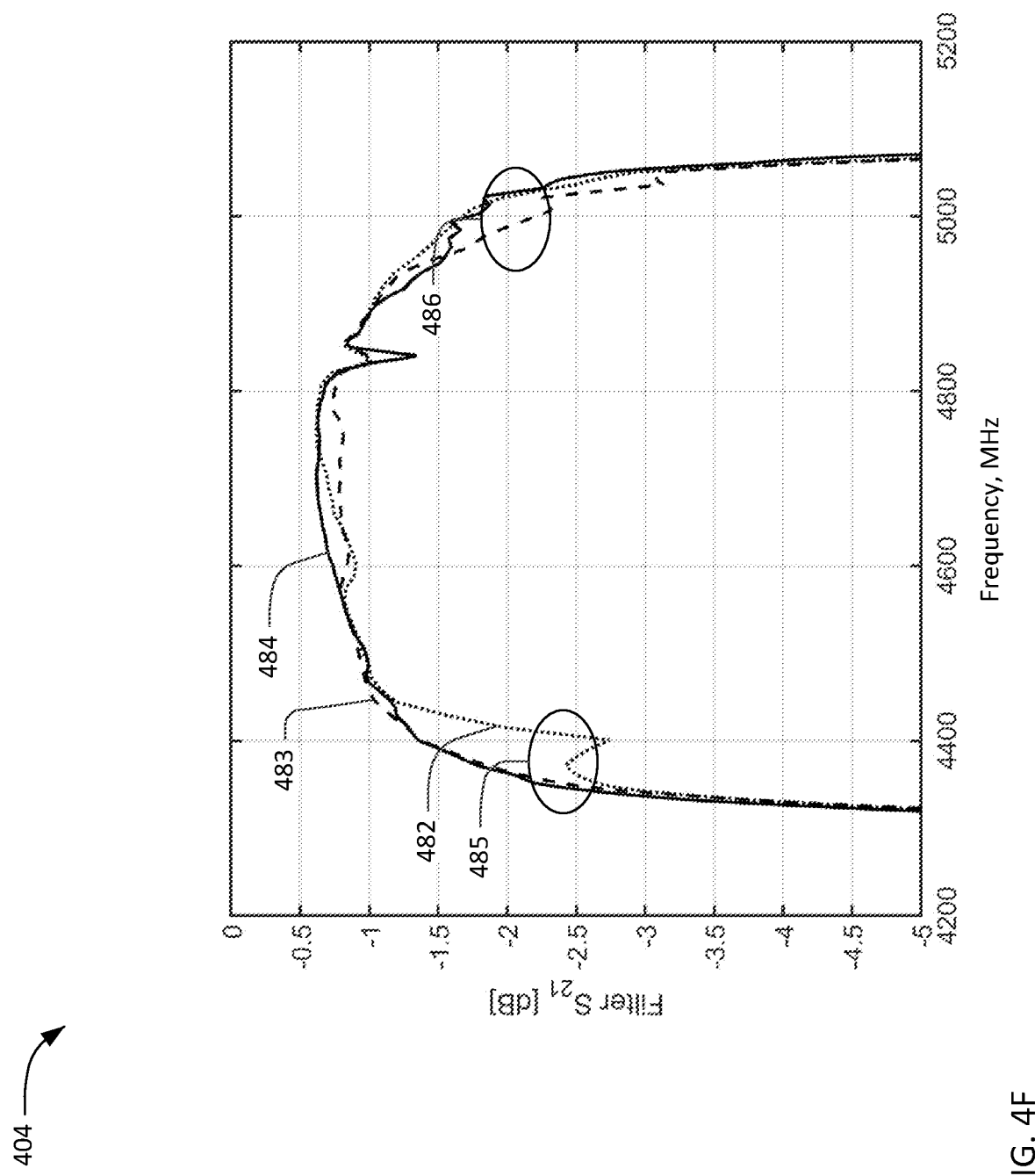
FIG. 4F is a chart of the magnitude of S21 of three 6-XBAR resonator filter devices as functions of frequency.

FIG. 4F is a chart 404 of the magnitude of S21, in dB, of three 6-XBAR resonator filter devices as functions of frequency. Chart 404 shows the normalized magnitude of the S21 (on a logarithmic scale) as a function of frequency for three XBAR filter devices, such as a version of filter 500, simulated using FEM simulation techniques. The dotted line 482 is a plot of S21 for the XBAR of chart 404 having gd=1 um. The dashed line 483 is a plot of S21 for the XBAR of chart 404 having gd=3 um. Line 482 has a loss at lower band edge 485 and line 483 has a loss at upper band edge 486. Thus, lines 482 and 483 show a lower band edge 485 and upper band edge 486 performance trade and no adequate solution is found.

However, solid line 484 is for a version of the shunt XBAR of graph 402 with gap distance gd=3 um, and with gap dielectric stripes in busbar-electrode gaps as noted herein. In this case, the stripe widths are sw=3 urn and the thicknesses st is 25 nm, although other widths and thickness may also be used. Line 484 shows that S21 at the lower band edge 485 is preserved as well as at the upper band edge 486. Consequently, the BE gap distance gd is tuned to the 3 um larger gap and the stripes (e.g., 438 and 439) are used to move the problematic 'gap mode' spurs, to a more favorable location in frequency space by lowering the frequency of the 'gap mode' spurs.

Figure 4G:
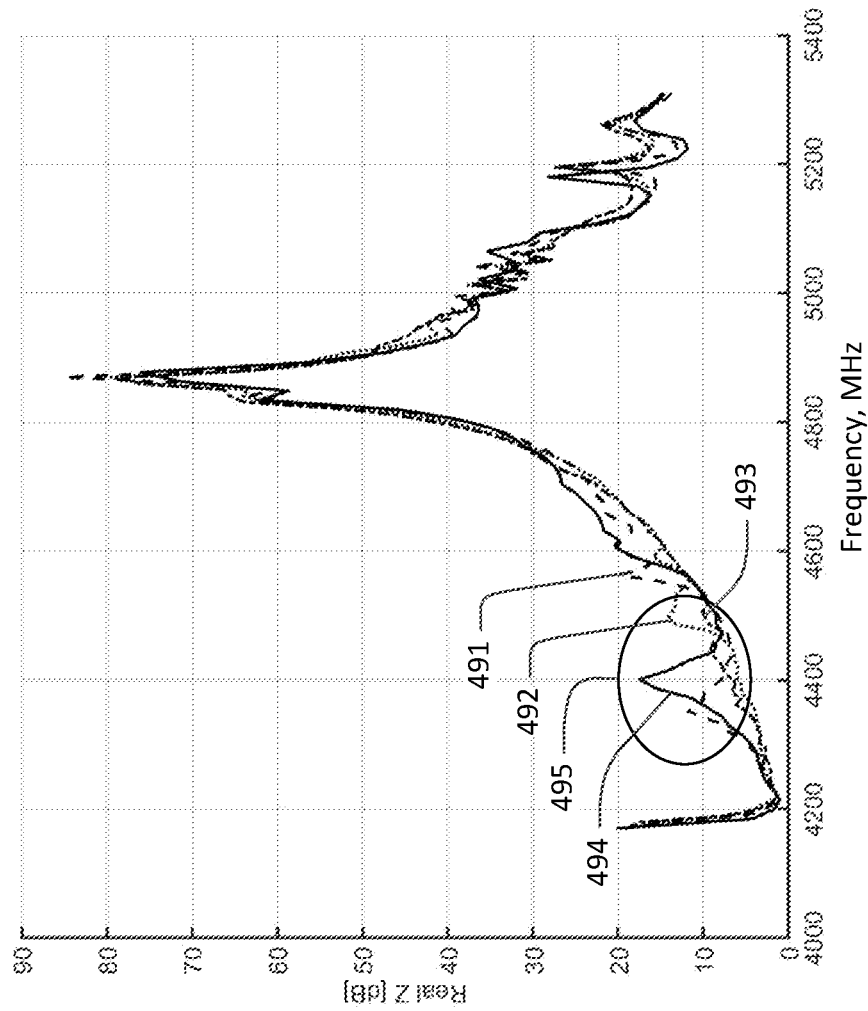
FIG. 4G is a chart of the Real Z S21 of four XBAR resonators as functions of frequency.

FIG. 4G is a chart 406 of the Real Z, in dB, S21 of four XBAR resonators as functions of frequency. Chart 406 shows the normalized magnitude of the Real Z S21 (on a logarithmic scale) as a function of frequency for four XBARs, such as a version of XBAR 400 or 450, simulated using FEM simulation techniques. The dashed lines 491, dotted lines 492, dash-dotted lines 493 and solid lines 494 are for four versions of the shunt XBAR of graph 402 with gap distance gd=3 um, and with gap dielectric stripes in busbar-electrode gaps as noted herein. In this case, the thicknesses st are 0 (No stripe), 5 nm for dashed line 491, 15 nm for dotted line 492 and 25 nm for dash-dotted line 491 and zero nm solid line 494; although other widths and thickness may also be used.

At a resonator level, the individual 'gap mode' spurs near the sensitive 4400 MHz frequency range at oval 495 are a function of the stripe thickness st. As thickness st increases, the critical spurs are advantageously moved down in frequency and are diminished in amplitude. In this example, little residual loss remains in the sensitive region 495 by a thickness st of 25 nm, which is a desirable improvement as compared to no stripes or the thinner stripes.

Thus, using the gap dielectric stripes in busbar-electrode gaps may serve two primary purposes: 1) to remove gap mode spurs by moving them lower in frequency and (potentially) reducing their magnitude; and 2) to improve acoustic confinement and limit energy leakage to the busbar region, improving device Q.

Figure 4H:
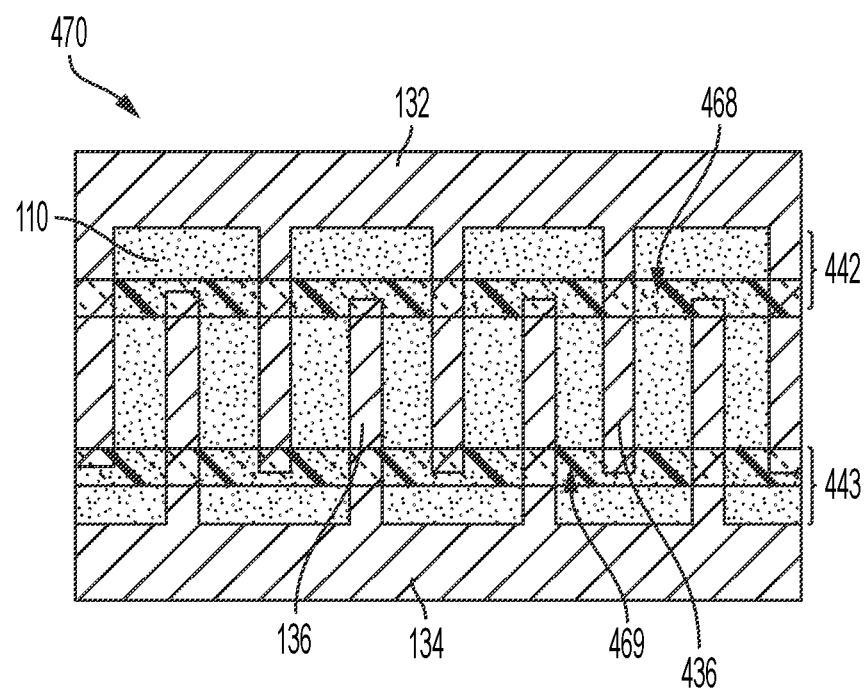
FIG. 4H shows a simplified schematic cross-sectional view of XBARs with gap dielectric stripes in busbar-electrode gaps over the fingers.

FIG. 4H shows a simplified schematic top view of an XBAR 470 with gap dielectric stripes in busbar-electrode gaps and having an 82Y-cut piezoelectric plate 110. The XBAR device 470 may represent a version of device 100, 300 and/or 350 described above. Preferably, the 82Y-cut piezoelectric plate is a lithium niobate material, and has Euler angles in the range (0, x, 90) with −15<x<0. As is understood in the art, a "cut" usually defines two things: 1) the plane of the crystal that is exposed, and 2) the direction of travel of the acoustic wave used (i.e., the direction perpendicular to the IDT fingers). The Y-cut family, such as 120Y and 128Y, are typically referred to as 120YX or 128YX, which is understood to mean that the plane of the crystal face is determined by 12 #Y, and the acoustic wave travels along the X. The Euler angles for 120YX and 128YX are (0, 120-90, 0) and (0, 128-90, 0) respectively. A "Z-cut" is typically referred to as a ZY cut, and is understood to mean that the plate surface is normal to the Z but the wave travels along the Y. The Euler angles for ZY cut are (0, 0, 90). As used herein, an 82Y-cut is a variation of a Z-cut. The Euler angles for 82Y-cut are (0, 82-90, 90). The normal to the crystal face in an 82Y-cut is defined similarly to how a 120Y-cut is defined, but the wave in an 82Y-cut travels in a direction similar to a ZY-cut (meaning that the IDT is aligned differently in an 82Y-cut than an 82YX-cut). Thus, as used herein, an 82Y-cut is not the same as an 82YX-cut.

XBAR device 470 represents a version of device 400 having gap dielectric stripes 468 and 469 that overlap the edges of the fingers in busbar-electrode (BE) gaps 442 and 443 between ends of interleaved fingers 136 and opposing busbar 132 and between ends of interleaved fingers 436 and opposing busbar 134, respectively. Device 470 may be a shunt or ground resonators of a filter device having serial resonators as described for FIG. 5.

According to an exemplary aspect, dielectric stripe 468 includes or is a stripe of dielectric material formed over the plate 110 in a BE gap 442 and over the ends of the interleaved fingers 136 in the BE gap 442 opposing busbar 132. Dielectric stripe 469 includes or is a stripe of dielectric material formed over the plate 110 in a BE gap 443 over the ends of the interleaved fingers 436 in the BE gap 443 opposing busbar 134. Although not shown in FIG. 4H, the dielectric stripes 468 and 469 could also extend over the busbar as well. In the previously described embodiments, the dielectric stripes have been referred to as a "gap coating," i.e., a strip of oxide in the gap which did not overlap with the ends of the IDT fingers. Such a gap coating was operable to move/suppress some spurs in the Y-cut family of cuts, near the 120Y-cut. However, such a gap coating did not help 3D spurs in a Z-cut (such as the 82Y-cut of FIG. 4G). Z-cut 3D spurs are of a different family and, as described below, may be suppressed when the dielectric stripes, such as the dielectric stripes 468 and/or 469, in a wider and thinner format than the aforementioned gap coating was applied and positioned so as to overlap the ends of the IDT fingers. In some cases, the dielectric stripes 468 and/or 469 may be considered wide oxide stripes (WOS) in comparison to the "gap coating" dielectric stripes discussed above, such as dielectric stripes 438, 439, 458, 459. As such, dielectric stripes that overlap with the ends of the IDT fingers do not optimally reduce 3D spurs in a Y-cut, and a gap coating that does not overlap the IDT fingers do not optimally reduce 3D spurs in a Z-cut.

Figure 4I:
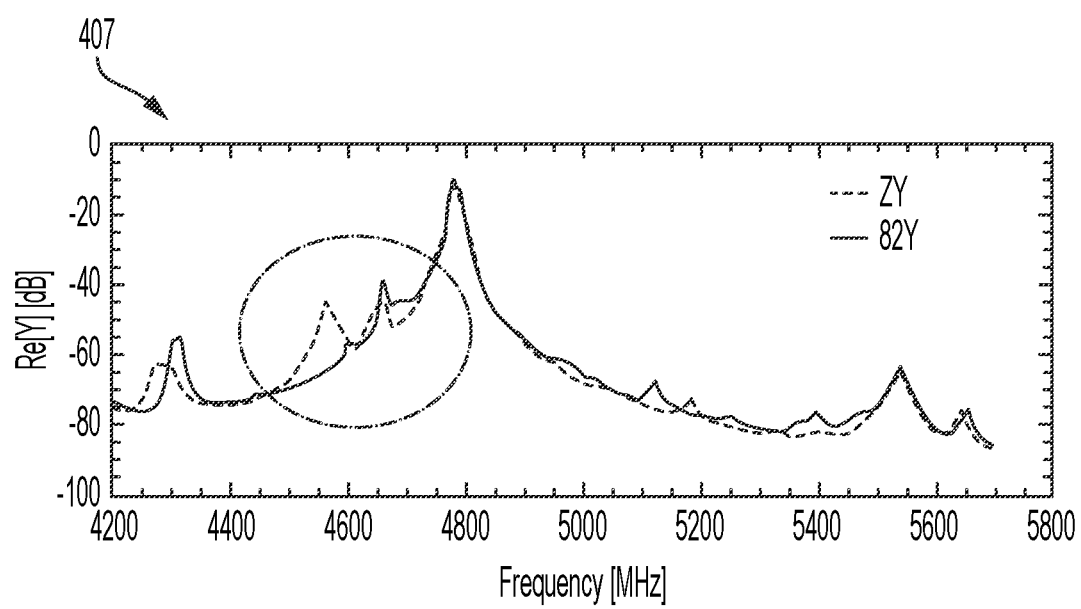
FIG. 4I is a chart of the Real Y as a function of frequency of an XBAR resonator of FIG. 4H having an 82Y-cut piezoelectric as compared to an XBAR resonator of FIG. 4H having a ZY-cut piezoelectric.

Advantageously, some spurs can be substantially reduced with the 82Y-cut piezoelectric. In series resonators, and as shown in chart 407 of FIG. 4I, a particularly problematic spur occurs just below resonance and affects the filter near the lower band edge. As can be seen in FIG. 4I, in a ZY-cut piezoelectric, this spur is relatively large. To minimize the effect on the filter passband, the thickness of the dielectric stripes can be dithered between different series resonators to misalign the location of their respective spurs. Still however, there results a substantial dip in the passband with the ZY-cut. As shown in FIG. 4I, the spur is substantially reduced when using the 82Y-cut piezoelectric with the dielectric stripes of FIG. 4H.

Figure 4J:
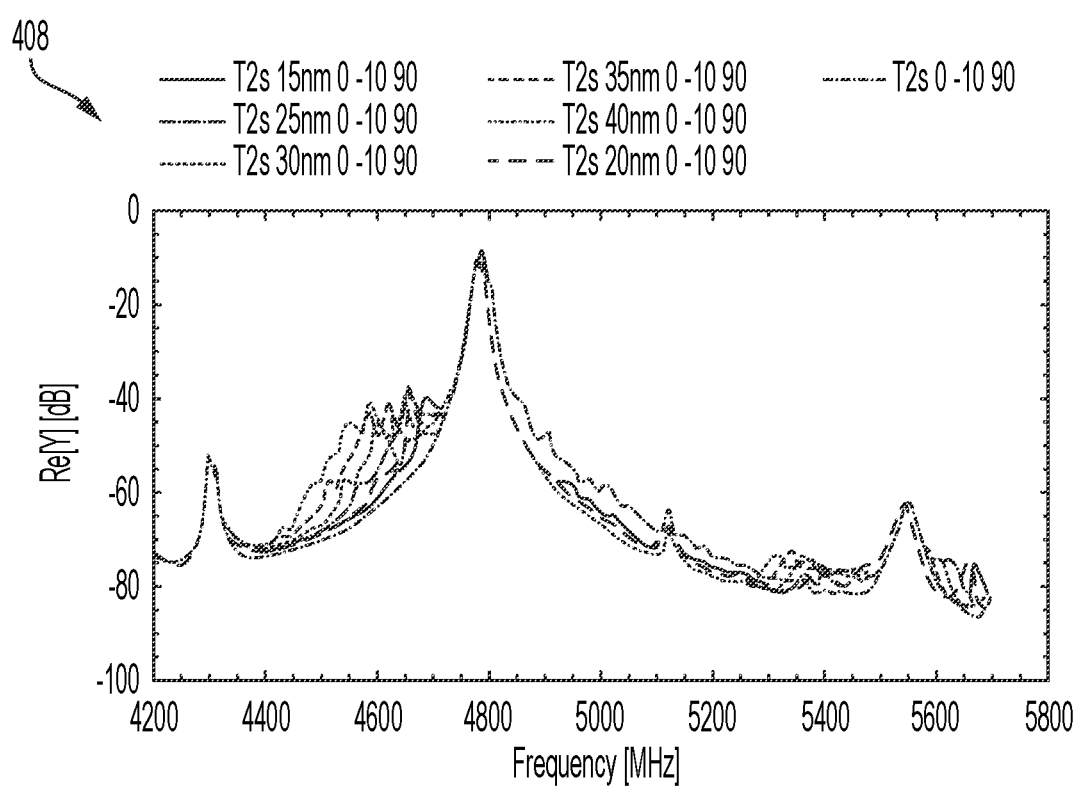
FIG. 4J is a chart of the Real Y as a function of frequency of XBAR resonators of FIG. 4H different thickness dielectric stripes.

FIG. 4J is a chart 408 of the Real Y, in dB, of seven XBAR resonators as functions of frequency. In particular, chart 408 illustrates the normalized magnitude of the Real Y (on a logarithmic scale) as a function of frequency for seven XBARs, such as a version of XBAR 470, simulated using FEM simulation techniques. The lines in chart 407 represent XBAR 470 with gap dielectric stripes in busbar-electrode gaps as noted herein. In this case, the thicknesses are 0 (No stripe), 15 nm, 20 nm, 25 nm, 30 nm, 35 nm, and 40 nm, and the thickness of the lithium niobate substrate was 368 nm. As can be seen from chart 408 in FIG. 4J, the optimal thickness is in the range of 10 nm-25 nm. This optimal thickness of the wide oxide stripes can thus be set at a ratio of approximately 0.02 to approximately 0.07 of the thickness of the lithium niobate substrate.

As can be seen in FIG. 4J, when reducing losses between resonance and antiresonance, setting the thickness of the dielectric stripes to around 30 nm is improved compared with 15-25 nm. Thus, in the 82Y-cut dielectric, with the spur amplitude substantially reduced, a thicker dielectric stripe (with corresponding loss reduction) can be used without detrimental spur amplitude. The spur amplitude still increases with the larger dielectric thickness in the 82Y-cut piezoelectric, but such a spur amplitude is not as detrimental as in a Z-cut piezoelectric.

Figure 5:
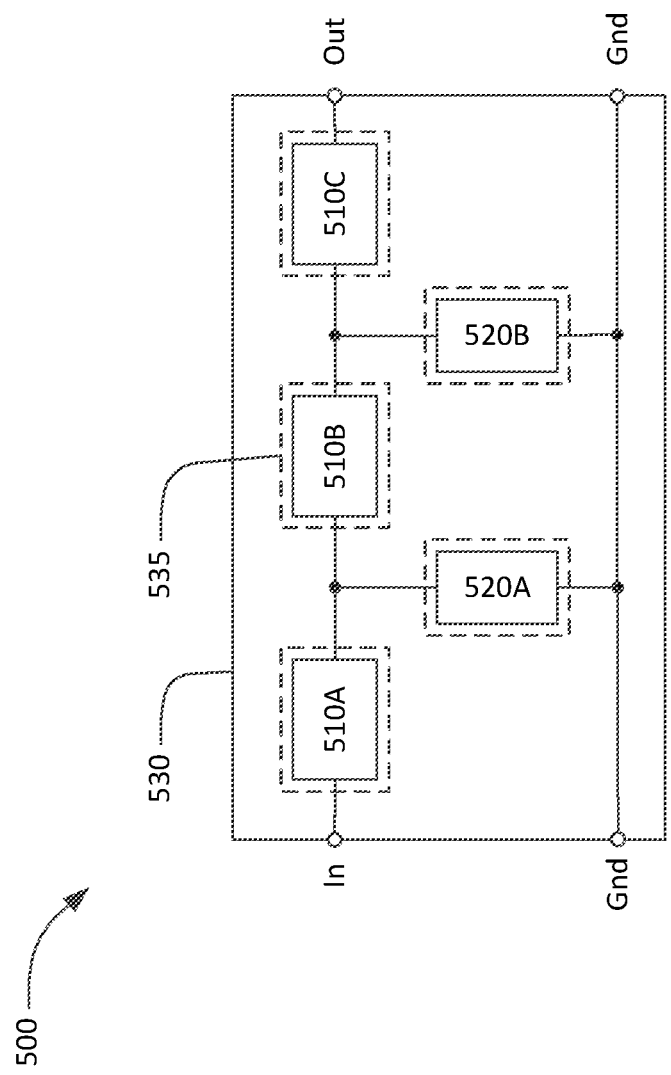
FIG. 5 is a schematic block diagram of a filter using XBARs.

FIG. 5 is a schematic circuit diagram and layout for a high frequency band-pass filter 500 using XBARs where the two connections to an XBAR that are shown are connections to the two busbars of the XBAR. The filter 500 has a conventional ladder filter architecture including three series resonators 510A, 510B, 510C and two shunt resonators 520A, 520B. The three series resonators 510A, 510B, and 510C are connected in series between a first port and a second port (hence the term "series resonator"). Any number of the resonators of filter 500 may be a XBAR 400 or 450; a version of XBAR 400 or 450; and/or a version of device 100, 300 or 350 and with stripes of a dielectric material formed over the plate in gaps between ends of the interleaved fingers and opposing busbars of the IDT. In FIG. 5, the first and second ports are labeled "In" and "Out", respectively. However, the filter 500 is bidirectional and either port may serve as the input or output of the filter. The two shunt resonators 520A, 520B are connected from nodes between the series resonators to ground. A filter may contain additional reactive components, such as inductors, not shown in FIG. 5. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and the input, the output, or a node between two series resonators.

In the exemplary filter 500, the three series resonators 510A, B, C and the two shunt resonators 520A, B of the filter 500 are formed on a single plate 530 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity.

Each of the resonators 510A, 510B, 510C, 520A, 520B in the filter 500 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 500. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are position above the upper edge of the passband.

Description of Methods

Figure 6:
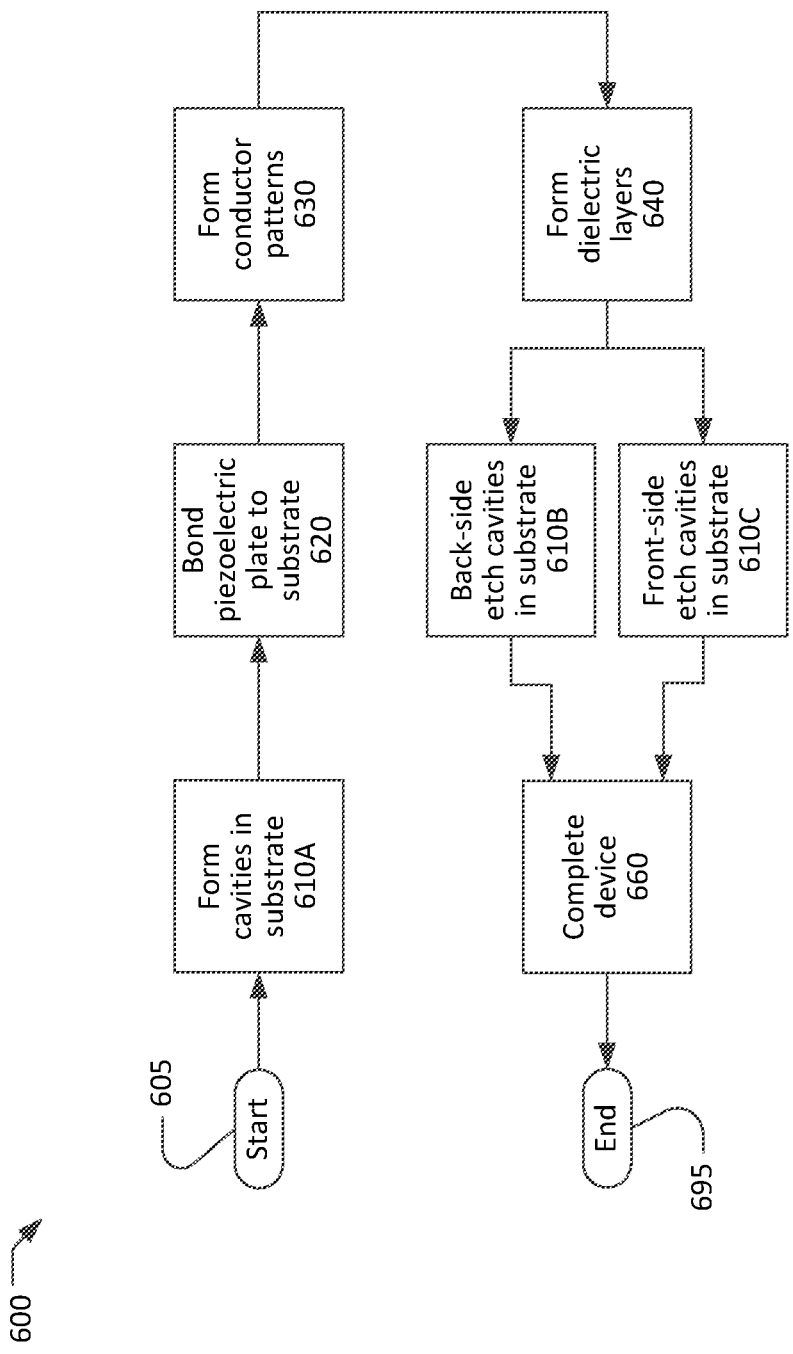
FIG. 6 is a flow chart of a process for fabricating an XBAR with gap dielectric stripes in busbar-electrode gaps.

FIG. 6 is a simplified flow chart showing a process 600 for making an XBAR or a filter incorporating XBARs. The process 600 may form an XBAR, a variation of an XBAR or an example of an XBAR as noted herein. The process 600 starts at 605 with a substrate and a plate of piezoelectric material and ends at 695 with a completed XBAR or filter. As will be described subsequently, the piezoelectric plate may be mounted on a sacrificial substrate or may be a portion of wafer of piezoelectric material. The flow chart of FIG. 6 includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 6.

The flow chart of FIG. 6 captures three variations of the process 600 for making an XBAR which differ in when and how cavities are formed in the substrate. The cavities may be formed at steps 610A, 610B, or 610C. Only one of these steps is performed in each of the three variations of the process 600.

The piezoelectric plate may be, for example, Z-cut, rotated Z-cut, or rotated Y-cut lithium niobate or lithium tantalate. In some cases, it is Y-cut or rotated Y-cut lithium niobate. The piezoelectric plate may be some other material and/or some other cut. The substrate may be silicon. The substrate or an intermediary layer of the substrate may be some material that allows formation of deep cavities by etching or other processing. The silicon substrate may have layers of silicon TOX and polycrystalline silicon.

In one variation of the process 600, at 610A one or more cavities are formed in the substrate 120 or 320; or an intermediary layer of the substrate, before the piezoelectric plate is bonded to the substrate at 620. A separate cavity may be formed for each resonator in a filter device. The one or more cavities may be formed using conventional photolithographic and etching techniques. These techniques may be isotropic or anisotropic; and may use deep reactive ion etching (DRIE). Typically, the cavities formed at 610A will not penetrate through the substrate or layer 322, and the resulting resonator devices will have a cross-section as shown in FIG. 3A.

At 620, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

In a first variation of 620, the piezoelectric plate is initially mounted on a sacrificial substrate. After the piezoelectric plate and the substrate are bonded, the sacrificial substrate, and any intervening layers, are removed to expose the surface of the piezoelectric plate (the surface that previously faced the sacrificial substrate). The sacrificial substrate may be removed, for example, by material-dependent wet or dry etching or some other process.

In a second variation of 620 starts with a single-crystal piezoelectric wafer. Ions are implanted to a controlled depth beneath a surface of the piezoelectric wafer (not shown in FIG. 6). The portion of the wafer from the surface to the depth of the ion implantation is (or will become) the thin piezoelectric plate and the balance of the wafer is effectively the sacrificial substrate. After the implanted surface of the piezoelectric wafer and device substrate are bonded, the piezoelectric wafer may be split at the plane of the implanted ions (for example, using thermal shock), leaving a thin plate of piezoelectric material exposed and bonded to the substrate. The thickness of the thin plate piezoelectric material is determined by the energy (and thus depth) of the implanted ions. The process of ion implantation and subsequent separation of a thin plate is commonly referred to as "ion slicing". The exposed surface of the thin piezoelectric plate may be polished or planarized after the piezoelectric wafer is split.

Conductor patterns and dielectric layers defining one or more XBAR devices are formed on the surface of the piezoelectric plate at 630. Typically, a filter device will have two or more conductor layers that are sequentially deposited and patterned. The conductor layers may include bonding pads, gold or solder bumps, or other means for making connection between the device and external circuitry. The conductor layers may be, for example, aluminum, an aluminum alloy, copper, a copper alloy, molybdenum, tungsten, beryllium, gold, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layers and the piezoelectric plate. The conductor layers may include bonding pads, gold or solder bumps, or other means for making connection between the device and external circuitry.

Conductor patterns may be formed at 630 by depositing the conductor layers over the surface of the piezoelectric plate and removing excess metal by etching through patterned photoresist. Alternatively, the conductor patterns may be formed at 630 using a lift-off process. Photoresist may be deposited over the piezoelectric plate and patterned to define the conductor pattern. The conductor layer may be deposited in sequence over the surface of the piezoelectric plate. The photoresist may then be removed, which removes the excess material, leaving the conductor pattern. In some cases, forming at 630 occurs prior to bonding at 620, such as where the IDT's are formed prior to bonding the plate to the substrate.

At 640, a front-side dielectric layer or layers may be formed by depositing one or more layers of dielectric material on the front side of the piezoelectric plate, over one or more desired conductor patterns of IDT or XBAR devices. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. In some cases, depositing at 640 includes depositing a first thickness of at least one dielectric layer over the front-side surface of selected IDTs, but no dielectric or a second thickness less than the first thickness of at least one dielectric over the other IDTs. An alternative is where these dielectric layers are only between the interleaved fingers of the IDTs.

The one or more dielectric layers may include, for example, a dielectric layer selectively formed over the IDTs of shunt resonators to shift the resonance frequency of the shunt resonators relative to the resonance frequency of series resonators as described in U.S. Pat. No. 10,491,192. The one or more dielectric layers may include an encapsulation/passivation layer deposited over all or a substantial portion of the device.

The different thickness of these dielectric layers causes the selected XBARs to be tuned to different frequencies as compared to the other XBARs. For example, the resonance frequencies of the XBARs in a filter may be tuned using different front-side dielectric layer thickness on some XBARs.

As compared to the admittance of an XBAR with tfd=0 (i.e. an XBAR without dielectric layers), the admittance of an XBAR with tfd=30 nm dielectric layer reduces the resonant frequency by about 145 MHz compared to the XBAR without dielectric layers. The admittance of an XBAR with tfd=60 nm dielectric layer reduces the resonant frequency by about 305 MHz compared to the XBAR without dielectric layers. The admittance of an XBAR with tfd=90 nm dielectric layer reduces the resonant frequency by about 475 MHz compared to the XBAR without dielectric layers. Importantly, the presence of the dielectric layers of various thicknesses has little or no effect on the piezoelectric coupling.

In a second variation of the process 600, one or more cavities are formed in the back side of the substrate at 610B after all the conductor patterns and dielectric layers are formed at 630. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In a third variation of the process 600, one or more cavities in the form of recesses in the substrate or top layer 322 may be formed at 610C by etching a sacrificial layer formed in the front side of the substrate using an etchant introduced through openings in the piezoelectric plate. A separate cavity may be formed for each resonator in a filter device. The one or more cavities may be formed using an isotropic or orientation-independent dry etch that passes through holes in the piezoelectric plate and etches the sacrificial layer formed in recesses in the front-side of the substrate. The one or more cavities formed at 610C will not penetrate completely through the substrate top layer 322, and the resulting resonator devices will have a cross-section as shown in FIG. 3A.

In all variations of the process 600, the filter or XBAR device is completed at 660. Actions that may occur at 660 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 660 is to tune the resonant frequencies of the resonators within a filter device by adding or removing metal or dielectric material from the front side of the device. After the filter device is completed, the process ends at 695. FIGS. 1-4C may show examples of the fingers of selected IDTs after completion at 660.

Process 600 may be or include fabricating an XBAR with gap dielectric stripes in busbar-electrode gaps. For example, step 640 and/or step 660 may include the formation of gap dielectric stripes in busbar-electrode gaps as noted herein. At 640 the stripes may be formed before formation of a front-side dielectric. At 660 the stripes may be formed before formation of a passivation layer. The stripes may be formed after formation and on top of a front-side dielectric layer and prior to formation of a passivation layer. Forming the stripes may include forming stripes of a dielectric material over the plate 110 in gaps between the ends of the interleaved fingers and the opposing busbars (e.g., adjacent to the ends) of the IDT. Forming the stripes may include selecting a width sw and thickness st of the strips to reduce acoustic energy leakage from the aperture in the transverse direction that is parallel to a length of the interleaved fingers. Selecting the width sw may be similar to selecting gap distance gd, such as when the strips cover the entire gap distance gd.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

What is claimed is:

1. An acoustic resonator device comprising:
   a substrate having a surface;
   an 82Y-cut lithium niobate piezoelectric plate attached to the surface of the substrate, the piezoelectric plate including a portion that forms a diaphragm that is over a cavity;
   an interdigital transducer (IDT) at the piezoelectric plate such that interleaved fingers of the IDT are on the diaphragm; and
   a plurality of stripes of a dielectric material that each have at least a portion that extends in a gap between the ends of the interleaved fingers and opposing busbars of the IDT,
   wherein the 82Y-cut lithium niobate piezoelectric plate has Euler angles in a range (0°, x, 90°) with $-15° < x < 0°$.

2. The acoustic resonator device of claim 1, wherein the IDT includes a first plurality of fingers attached to a first busbar of the opposing busbars and a second plurality of fingers attached to a second busbar of the opposing busbars, such that the interleaved fingers include the first plurality of fingers and the second plurality of fingers.

3. The acoustic resonator device of claim 1, wherein the plurality of stripes of the dielectric material have a width of between 2 um and 5 um, and wherein the width is measured in a direction perpendicular to a lengthwise direction of the interleaved fingers.

4. The acoustic resonator device of claim 3, wherein the plurality of stripes of the dielectric material have a thickness of between 10 nm and 50 nm, and wherein the thickness is measured in a direction normal to the surface of the substrate.

5. The acoustic resonator device of claim 1, wherein the plurality of stripes of the dielectric material have a thickness of 30 nm, and wherein the thickness is measured being in a direction normal to the surface of the substrate.

6. The acoustic resonator device of claim 1, wherein each of the plurality of stripes of the dielectric material comprises a thickness that is 0.02 to 0.07 of a respective thickness of the piezoelectric plate, and whereinthe respective thicknesses is measured in a direction normal to the surface of the substrate.

7. The acoustic resonator device of claim 1, wherein the plurality of stripes are configured to lower an amplitude of and a frequency range of output gap mode spurs appearing immediately below the resonant frequency of the resonator.

8. The acoustic resonator device of claim 1, wherein the cavity extends into an intermediate dielectric layer of the substrate.

9. The acoustic resonator device of claim 1, wherein the IDT is configured to excite shear acoustic waves in the piezoelectric plate in response to respective radio frequency signals applied to the IDT.

10. The acoustic resonator device of claim 1, wherein at least a portion of each of the plurality of stripes of the dielectric material overlaps at least an end of one or more fingers of the interleaved fingers.

11. The acoustic resonator device of claim 1, wherein at least one stripe of the plurality of stripes of the dielectric material extends in a direction substantially parallel to the first busbar and in a gap that extends contiguously without any intervening items between the first busbar and ends of the second plurality of fingers attached to the second busbar.

12. An acoustic resonator device comprising:
a substrate having a surface;
an 82Y-cut lithium niobate piezoelectric plate attached to the surface of the substrate, the piezoelectric plate including a portion that forms a diaphragm that is over a cavity;
an interdigital transducer (IDT) at the piezoelectric plate such that interleaved fingers of the IDT are disposed on the diaphragm; and
at least one stripe of a dielectric material that has at least a portion that extends in a gap between the ends of the interleaved fingers and an opposing busbar facing the ends of the interleaved fingers,
wherein the 82Y-cut lithium niobate piezoelectric plate has Euler angles in a range (0°, x, 90°) with−15° <x<0°.

13. The acoustic resonator device of claim 12,
wherein the at least one stripe has a width of between 2 um and 5 um, and wherein the width is measured in a direction perpendicular to a lengthwise direction of the interleaved fingers, and
wherein the at least one stripe has a thickness of between 10 nm and 50 nm, and wherein the thickness is measured being in a direction normal to the surface of the substrate.

14. The acoustic resonator device of claim 12, wherein the at least one stripe has a thickness of 30 nm, and wherein the thickness is measured in a direction normal to the surface of the substrate.

15. The acoustic resonator device of claim 12, wherein the at least one stripe of the dielectric material comprises a thickness that is 0.02 to 0.07 of a respective thickness of the piezoelectric plate, and wherein the respective thicknesses are measured in a direction normal to the surface of the substrate.

16. The acoustic resonator device of claim 12, wherein the cavity extends into an intermediate dielectric layer of the substrate.

17. The acoustic resonator device of claim 12, wherein the IDT is configured to excite shear acoustic waves in the piezoelectric plate in response to respective radio frequency signals applied to the IDT.

18. A method of fabricating an acoustic resonator device comprising:
attaching a substrate to an 82Y-cut lithium niobate piezoelectric plate that has Euler angles in a range (0°, x, 90°) with−15° <x<0°;
forming an interdigital transducer (IDT) on a side of the piezoelectric plate, the IDT comprising interleaved fingers, an overlapping distance of the interleaved fingers defining an aperture of the acoustic resonator device; and
forming a plurality of stripes of a dielectric material in gaps between the ends of the interleaved fingers and opposing busbars of the IDT.

19. The acoustic resonator device of claim 12, wherein at least a portion of the at least one stripe of the dielectric material overlaps at least an end of one or more fingers of the interleaved fingers.

20. The acoustic resonator device of claim 12, wherein:
wherein the IDT includes a first plurality of fingers attached to a first busbar of the opposing busbars and a second plurality of fingers attached to a second busbar of the opposing busbars, the interleaved fingers including the first plurality of fingers and the second plurality of fingers, and
the at least one stripe of the dielectric material extends in a direction substantially parallel to the first busbar and in a gap that extends contiguously without any intervening items between the first busbar and ends of the second plurality of fingers attached to a second busbar.

* * * * *